US008422268B2

(12) United States Patent
Arita et al.

(10) Patent No.: US 8,422,268 B2
(45) Date of Patent: Apr. 16, 2013

(54) CURRENT CONTROL ELEMENT, MEMORY ELEMENT, AND FABRICATION METHOD THEREOF

(75) Inventors: Koji Arita, Osaka (JP); Takumi Mikawa, Shiga (JP); Mitsuteru Iijima, Osaka (JP); Takashi Okada, Osaka (JP)

(73) Assignee: Panasonic Corporation, Osaka (JP)

( * ) Notice: Subject to any disclaimer, the term of this patent is extended or adjusted under 35 U.S.C. 154(b) by 357 days.

(21) Appl. No.: 12/677,413

(22) PCT Filed: May 1, 2009

(86) PCT No.: PCT/JP2009/001988
§ 371 (c)(1),
(2), (4) Date: Mar. 10, 2010

(87) PCT Pub. No.: WO2010/004675
PCT Pub. Date: Jan. 14, 2010

(65) Prior Publication Data
US 2011/0002155 A1    Jan. 6, 2011

(30) Foreign Application Priority Data

Jul. 11, 2008  (JP) ................................. 2008-180945

(51) Int. Cl.
G11C 11/34      (2006.01)
G11C 11/36      (2006.01)
H01L 29/12      (2006.01)

(52) U.S. Cl.
USPC ............... 365/148; 365/174; 365/175; 257/2; 257/4; 257/471

(58) Field of Classification Search .................. 365/148; 257/2–4, 471
See application file for complete search history.

(56) References Cited

U.S. PATENT DOCUMENTS 5,126,825 A    6/1992   Harada
5,155,565 A   10/1992   Wenz et al.
5,272,370 A   12/1993   French
(Continued)

FOREIGN PATENT DOCUMENTS

EP    1467376 A3    2/2006
EP    2 128 901 A1  12/2009
(Continued)

OTHER PUBLICATIONS

International Search Report issued in International Patent Application No. PCT/JP2007/073242 dated Mar. 4, 2008.

(Continued)

*Primary Examiner* — Allison P Bernstein
(74) *Attorney, Agent, or Firm* — McDermott Will & Emery LLP

(57) ABSTRACT

A memory element (3) arranged in matrix in a memory device and including a resistance variable element (1) which switches its electrical resistance value in response to a positive or negative electrical pulse applied thereto and retains the switched electrical resistance value; and a current control element (2) for controlling a current flowing when the electrical pulse is applied to the resistance variable element (1); wherein the current control element (2) includes a first electrode; a second electrode; and a current control layer sandwiched between the first electrode and the second electrode; and wherein the current control layer comprises $SiN_x$, and at least one of the first electrode and the second electrode comprises α-tungsten.

12 Claims, 17 Drawing Sheets

U.S. PATENT DOCUMENTS

| | | |
|---|---|---|
| 6,753,561 B1 | 6/2004 | Rinerson et al. |
| 6,917,539 B2 | 7/2005 | Rinerson et al. |
| 7,812,404 B2 | 10/2010 | Herner et al. |
| 2003/0231082 A1 | 12/2003 | Takata et al. |
| 2004/0202041 A1 | 10/2004 | Hidenori et al. |
| 2005/0093157 A1* | 5/2005 | Noguchi et al. ............. 257/753 |
| 2005/0233553 A1 | 10/2005 | Kountz et al. |
| 2006/0063025 A1* | 3/2006 | Huang et al. ................. 428/627 |
| 2006/0097240 A1 | 5/2006 | Lowrey et al. |
| 2006/0219546 A1 | 10/2006 | Jan et al. |
| 2006/0250836 A1 | 11/2006 | Herner et al. |
| 2006/0250837 A1 | 11/2006 | Herner et al. |
| 2007/0015330 A1 | 1/2007 | Li et al. |
| 2008/0232160 A1 | 9/2008 | Gopalakrishnan |
| 2009/0052225 A1 | 2/2009 | Morimoto |
| 2010/0032641 A1 | 2/2010 | Mikawa et al. |
| 2010/0061142 A1* | 3/2010 | Arita et al. .................... 365/148 |
| 2010/0065807 A1 | 3/2010 | Takagi et al. |
| 2010/0172171 A1 | 7/2010 | Azuma et al. |

FOREIGN PATENT DOCUMENTS

| | | |
|---|---|---|
| JP | 61-174509 | 8/1986 |
| JP | 61-174589 | 8/1986 |
| JP | 64-030273 | 2/1989 |
| JP | 03-057214 | 3/1991 |
| JP | 03-283469 A | 12/1991 |
| JP | 04-253024 | 9/1992 |
| JP | 08-325735 | 12/1996 |
| JP | 2004-006673 | 1/2004 |
| JP | 2004-319587 | 11/2004 |
| JP | 2006-203098 | 8/2006 |
| JP | 2007074513 * | 3/2007 |
| JP | 2007-293969 | 11/2007 |
| WO | WO 2006/121837 A2 | 11/2006 |
| WO | WO 2008/062688 A1 | 5/2008 |
| WO | WO 2008/117494 A1 | 10/2008 |
| WO | WO 2008/149493 A1 | 12/2008 |
| WO | WO 2009/011113 A1 | 1/2009 |

OTHER PUBLICATIONS

P. Temple-Boyer et al., Thin Solid Film 414 (2002) p. 13-17 "Properties of nitrogen doped silicon films deposited by low pressure chemical vapor deposition from disilane and ammonia".

Extended European Search Report mailed Dec. 10, 2012 issued in corresponding EP Application No. 07832907.5.

* cited by examiner (a)

(b)

(a)

(b)

(a)

(b)

(a)

←W (b)

←W (a)

(b)

(a)

(b)

CURRENT CONTROL ELEMENT, MEMORY ELEMENT, AND FABRICATION METHOD THEREOF

RELATED APPLICATIONS

This application is the U.S. National Phase under 35 U.S.C. §371 of International Application No. PCT/JP2009/001988, filed on May 1, 2009, which in turn claims the benefit of Japanese Application No. 2008-180945, filed on Jul. 11, 2008, the disclosures of which Applications are incorporated by reference herein.

TECHNICAL FIELD

The present invention relates to a current control element incorporated into a nonvolatile memory element which is adapted for higher integration and achievement of a higher speed, a memory element incorporating the current control element, and fabrication methods thereof.

BACKGROUND ART

With recent advancement of digital technologies, electronic hardware such as portable information devices and home information appliances have been developed to achieve higher functionality. With the achievement of higher functionality of the electronic hardware, development of larger-scale, highly-integrated, and higher-speed nonvolatile memory devices incorporated thereinto have been progressing at a high pace, and the uses thereof have been spreading at a rapid pace.

Among the nonvolatile memory devices, a memory device including nonvolatile resistance variable elements used as memory elements and arranged in matrix is proposed. This memory device is expected to achieve larger scale, higher integration, and higher speed as a three-dimensional memory.

The resistance variable element has a thin layer which is made of a material mostly composed of a metal oxide. Upon application of an electrical pulse to the thin layer, its electrical resistance value switches, and the switched electrical resistance value is retained. By corresponding a high-resistance state and a low-resistance state of the thin layer to binary data "1" and "0," respectively, for example, the binary data can be stored in the resistance variable element. The current density of the electrical pulse applied to the thin layer of the resistance variable element or the magnitude of the electrical field generated by application of the electrical pulse is set to be large enough to change a physical state of the thin layer but not so large as to destroy the thin layer.

Among the resistance variable elements which are adapted to have binary values, a resistance variable element (so-called unipolar resistance variable element) which switches its resistance value upon application of electrical pulses with the same polarity and different voltages to the element, and a resistance variable element (so-called bipolar resistance variable element) which switches its resistance value upon application of electrical pulses with different polarities to the element, are known. In general, the unipolar resistance variable element requires a longer write time to switch from a low-resistance state to a high-resistance state (so-called reset) than to switch from the high-resistance state to the low-resistance state (so-called set). On the other hand, the bipolar resistance variable element is capable of writing data in a short time in both of the set and the reset.

In the memory device (so-called cross-point memory device) including the plural above-mentioned resistance variable elements respectively arranged at three-dimensional cross sections of plural word lines and plural bit lines which cross each other at a right angle so as not to contact each other, a problem (hereinafter this problem is referred to as "write disturb") could occur, in which an electrical resistance value of another resistance variable element switches due to a leakage current, when data is written to a certain resistance variable element. For this reason, in forming such a cross-point memory device, a special configuration is required to prevent the write disturb.

The unipolar resistance variable element is capable of switching its resistance in response to electrical pulses with the same polarity. Therefore, the write disturb can be prevented by arranging a unipolar current control element (having a nonlinear voltage-current characteristic having a high-resistance state and a low-resistance state in a voltage range of one voltage polarity), such as a p-n junction diode or a Schottky diode, in series with the resistance variable element.

As a memory device capable of preventing the write disturb, a memory device is disclosed, in which a memory element has a series circuit including a resistance variable element and a Schottky diode (current control element) (see patent document 1, for example).

In this proposed memory device, a leakage current flowing toward a resistance variable element is blocked by the Schottky diode in memory elements other than a memory element to which data should be written (so-called selected memory element). Thus, in the cross-point memory device, the write disturb is prevented. In this proposed memory device, data is written to the resistance variable element by applying electrical pulses with the same polarity to the resistance variable element. Therefore, the Schottky diode connected in series with the resistance variable element does not impede writing of data.

In contrast, in the case of using the bipolar resistance variable element, bipolar electrical pulses are used to write data in the resistance variable element. Therefore, it is necessary to arrange a bipolar current control element (having a nonlinear voltage-current characteristic having a high-resistance state and a low-resistance state in a voltage range of positive and negative polarities, respectively) in series with the resistance variable element. As the element having such a characteristic, two-terminal elements such as a MIM (Metal-Insulator-Metal) diode, a MSM (Metal-Semiconductor-Metal) diode and a varistor are known.

FIG. 17 is a view schematically showing a current-voltage characteristic of a current control element, in which FIG. 17(a) is a view of a voltage-current characteristic of a bipolar current control element such as the MIM diode, the MSM diode, or the varistor, and FIG. 17(b) is a view of a voltage-current characteristic of the Schottky diode.

As shown in FIG. 17(b), the Schottky diode exhibits a non-linear electrical resistance characteristic but exhibits a current-voltage characteristic which is far from being symmetric with respect to the polarity of the applied voltage.

On the other hand, as shown in FIG. 17(a), the two-terminal element such as the MIM diode, the MSM diode, or the varistor exhibits a non-linear electrical resistance characteristic and exhibits a current-voltage characteristic which is substantially symmetric with respect to the polarity of the applied voltage. To be specific, a change in the current with respect to a positive voltage applied and a change in the current with respect to a negative voltage applied are substantially symmetric with respect to an origin 0. In these two-terminal elements, an electrical resistance is very high in a range (i.e., range C) in which the applied voltage is not larger than a first critical voltage (the lower limit voltage in a range A) and is not smaller than a second critical voltage (the upper limit voltage in a range B), whereas the electrical resistance drastically decreases in a range in which the applied voltage is larger than the first critical voltage or smaller than the second critical voltage. In other words, these two-terminal elements exhibit a non-linear electrical resistance characteristic in which a large current flows when the applied voltage is larger than the first critical voltage or is smaller than the second critical voltage.

Therefore, by using these two terminal elements as the bipolar current control elements, the write disturb can be avoided in the cross-point memory device incorporating the bipolar resistance variable elements which are capable of a high-speed operation in both of the set and the reset.

To allow the resistance variable element to switch to a high-resistance state or to a low-resistance state by applying an electrical pulse to the resistance variable element to change the electrical resistance value, when writing data to the resistance variable element in the resistance variable memory device, in most situations, it is necessary to feed a large current to the resistance variable element, although it depends on the material or structure of the resistance variable element, etc. For example, it is disclosed that a current with a density of 30000A/cm$^2$ or higher is flowed using the varistor when writing data to the resistance variable element, in the operation of the memory device including the resistance variable elements (e.g., patent document 2).

Tungsten has three states which are called α-state, β-state and amorphous state. Patent document 3 discloses β-tungsten as tungsten used for a wire material.

PRIOR ART DOCUMENT

Patent Document

Patent document 1: Japanese Laid-Open Patent Application Publication No. 2004-319587

Patent document 2: Japanese Laid-Open Patent Application Publication No. 2006-203098

Patent document 3: Japanese Laid-Open Patent Application Publication No. Hei. 3-57214

SUMMARY OF THE INVENTION

Problems to be Solved by the Invention

As disclosed in the prior art patent documents, the above mentioned bipolar current control element is required to achieve the cross-point nonvolatile memory device incorporating the bipolar resistance variable elements which are capable of a high-speed operation. To allow the resistance variable element to switch to a high-resistance state or to a low-resistance state by applying an electrical pulse to the resistance variable element to change the electrical resistance value, when writing data to the resistance variable element in the resistance variable memory device, in most situations, it is necessary to feed a large current to the resistance variable element, although it depends on the material or structure of the resistance variable element, etc. In light of this, the MIM diode having a structure in which an insulating film is sandwiched between electrodes has a drawback that it cannot allow a sufficiently large current to flow. The varistor has a drawback that it exhibits a current steering characteristic originated from the crystal grain boundary characteristic of a material sandwiched between electrodes and therefore its current control element characteristic has variation, when applied to a multi-layer memory having a layer structure, etc. The MSM diode has a structure in which semiconductor is sandwiched between metal electrodes and is expected to have a higher current feed capability than the MIM diode. In addition, since the MSM diode does not use the crystal grain boundary characteristic or the like, it is less affected by thermal history or the like during fabrication and is expected to serve as a current control element with less variation. However, the MSM diode which can flow a current with a density of 30000A/cm$^2$ or higher, as disclosed in Patent document 2, has not been reported yet.

In view of the above mentioned problems, the present invention discloses semiconductor materials and electrode materials which are suitably used for a bipolar MSM diode having a current feed capability with a high current density and process stability, and provides a cross-point nonvolatile memory device incorporating a bipolar resistance variable element along with the MSM diode.

The present invention provides a MSM diode which is the above mentioned bipolar current control element and is capable of feeding a current with a density of 30000A/cm$^2$ or higher, and a fabrication method thereof. An object of the present invention is to provide a current control element which enables achievement of a larger scale, higher integration and higher speed of a nonvolatile memory device, a memory element incorporating the current control element, and fabrication methods thereof.

Means for Solving the Problems

To solve the above described objective, a current control element of the present invention is a current control element for controlling a current flowing when a positive or negative electrical pulse is applied, comprising a first electrode; a current control layer; and a second electrode; wherein the current control layer comprises SiN$_x$, and at least one of the first electrode and the second electrode comprises α-tungsten (α-W) having a body-centered cubic lattice (bcc) structure. As used herein, SiN$_x$ is silicon nitride, and the value of x indicates a nitrogen content.

In such a configuration, it is possible to provide a current control element which is capable of obtaining a current steering characteristic due to the potential barrier between the first electrode and the second electrode and the adjacent current control layer, capable of preventing write disturb even when the electrical pulses with different polarities are applied, capable of flowing a current required to switch resistance through a selected resistance variable element, and capable of preventing the current required to switch resistance from flowing through unselected resistance variable elements.

The bandgap of the current control layer can be controlled by controlling the value of x (i.e., nitrogen content of SiN$_x$) of SiN$_x$. Therefore, by controlling the bandgap of the current control layer depending on the kind of the material of the electrodes constituting the current control element along with the current control layer, the height of potential barrier between the electrodes and the adjacent current control layer can be controlled, which allows the use of various materials for the electrodes constituting the current control element. This results in an advantage that flexibility of fabrication process of the current control element and the memory element including the same is improved. Furthermore, SiN$_x$ is frequently used in semiconductor industry. Therefore, it is possible to provide current control elements, with applying corrective and preventive maintenance methods of a semiconductor fabrication line, and with the existing equipment used for the film deposition, etching, etc, and process conditions for the equipment to be easily modified to be compatible with production of the element including SiN$_x$, and have high productivity.

α-W may be applied to at least one of the first electrode and the second electrode. W is frequently used in semiconductor industry. Therefore, it is possible to provide current control elements with applying corrective and preventive maintenance methods of a semiconductor fabrication line, and with the existing equipment used for the film deposition, etching, etc, and process conditions for the equipment to be easily modified to be compatible with production of the element including W, and have high productivity. Furthermore, W is a material being less susceptible to electromigration, and therefore is more desirable to improve reliability of the current control element.

In the current control element, the current control layer may comprise $SiN_x$ ($0<x\leq0.85$).

Or, the current control layer may comprise $SiN_x$ ($0.3\leq x\leq0.6$). Thereby, in addition to obtaining a good current steering characteristic, the height of the potential barrier between the first electrode and the second electrode, and the adjacent current control layer can be more suitably controlled, and the current can be flowed through the current control element with a density of $30000A/cm^2$ or higher. As a result, when writing data to the resistance variable element, the current can be flowed with a density of $30000A/cm^2$ or higher.

To solve the above mentioned problem, a method of fabricating a current control element of the present invention is a method of fabricating a current control element, including the steps of forming a first electrode; forming a current control layer comprising $SiN_x$, and forming a second electrode, the current control element being configured to control a current flowing when a positive or negative electrical pulse is applied, comprises the steps of: forming at least one of the first electrode and the second electrode using α-W, wherein the step of forming the current control layer includes a step of sputtering using a target comprising a polycrystalline silicon under a nitrogen-containing atmosphere.

In such a configuration, since the value of x of $SiN_x$ which is the current control layer can be controlled only based on the environment (gas flow ratio of nitrogen) during sputtering, film deposition of $SiN_x$ based on the controlled x is easily carried out. In addition, a DC sputtering process which is commonly used in a semiconductor fabrication process can be used and therefore is desirable from the viewpoint of reliability of the film deposition equipment. Further, since the polycrystalline silicon is used as the target material, it is easy to form a large-diameter target having a high purity. For this reason, it is easy to form a $SiN_x$ film having a large area and containing less impurities (therefore the characteristic is well controlled based on the value of x) and as a result, it is possible to use a large-diameter wafer, for example. Thus, a fabrication method which is excellent in terms of quality control and productivity is achieved.

In the method of fabricating the current control element, the step of forming the current control layer comprising $SiN_x$ may be a step of forming the current control layer comprising $SiN_x$ ($0<x\leq0.85$).

In the method of fabricating the current control element, the step of forming α-tungsten may include a step of sputtering using a target comprising tungsten, in an argon-containing atmosphere in which the total gas pressure is 0.8 Pa or lower.

The fabrication method may further include forming α-W having a bcc structure, as at least one of the first electrode and the second electrode. W is frequently used in semiconductor industry. Therefore, it is possible to provide a fabrication method of the current control elements with applying corrective and preventive maintenance methods of a semiconductor fabrication line, and with the existing equipment used for the film deposition, etching, etc, and process conditions for the equipment to be easily modified to be compatible with production of the element including W, and have high productivity. Furthermore, since W is a material being less susceptible to electromigration, the fabrication method of the current control element with high reliability can be provided.

To solve the above mentioned problem, a memory element of the present invention comprises a resistance variable element which switches its electrical resistance value in response to a positive or negative electrical pulse applied thereto and retains the switched electrical resistance value; and a current control element for controlling a current flowing when the electrical pulse is applied to the resistance variable element; wherein the current control element includes a first electrode; a second electrode; and a current control layer sandwiched between the first electrode and the second electrode; and wherein the current control layer comprises $SiN_x$, and at least one of the first electrode and the second electrode comprises α-W.

In such a configuration, it is possible to provide a memory element which is capable of writing data without any problem, i.e., capable of preventing write disturb even when electrical pulses with different polarities are applied and capable of flowing a large current through the resistance variable element even when the metal oxide is used for the resistance variable layer of the resistance variable element.

When $SiN_x$ is applied to the current control layer, the bandgap of the current control layer can be controlled by controlling the value of x (i.e., nitrogen content of $SiN_x$) of $SiN_x$. Therefore, by controlling the bandgap of the current control layer depending on the kind of the material of the electrodes constituting the current control element along with the current control layer, the height of potential barrier between the electrodes and the adjacent current control layer can be controlled, which allows the use of various materials for the electrodes constituting the current control element. This results in an advantage that flexibility of the configuration of the memory element is improved. Furthermore, $SiN_x$ is frequently used in semiconductor industry. Therefore, it is possible to provide memory elements which allow maintenance and security methods of a semiconductor fabrication line, the existing equipment used for the film deposition, etching, etc, and process conditions for the equipment to be easily modified to be compatible with production of the element including $SiN_x$ and have high productivity.

In the memory element, the current control layer may comprise $SiN_x$ ($0<x\leq0.85$).

α-tungsten having a bcc structure may be applied to at least one of the first electrode and the second electrode. W is frequently used in semiconductor industry. Therefore, it is possible to provide current control elements with applying corrective and preventive maintenance methods of a semiconductor fabrication line, and with the existing equipment used for the film deposition, etching, etc, and process conditions for the equipment to be easily modified to be compatible with production of the element including W, and have high productivity. Furthermore, W is a material being less susceptible to electromigration, and therefore is more desirable to improve reliability of the memory element.

The current control layer may comprise $SiN_x$ ($0.3\leq x\leq0.6$). Thereby, in addition to obtaining a good current steering characteristic, the height of the potential barrier between the first electrode and the second electrode, and the adjacent current control layer can be more suitably controlled and the current can be flowed through the current control element with a density of $30000A/cm^2$ or higher. As a result, when writing data to the resistance variable element, the current can be flowed with a density of $30000A/cm^2$ or higher.

A method of fabricating a memory element of the present invention comprises the steps of: forming a resistance variable element which switches its electrical resistance value in response to a positive or negative electrical pulse applied thereto and retains the switched electrical resistance value; and forming the current control element for controlling a current flowing when the electrical pulse is applied to the resistance variable element; wherein the step of forming the current control element includes a step of forming a second electrode, a step of forming the current control layer comprising $SiN_x$ and a step of forming a first electrode, and the method further comprises forming at least one of the first electrode and the second electrode with α-W; wherein the step of forming the current control layer includes a step of sputtering using a target comprising polycrystalline silicon in a nitrogen-containing environment.

In such a configuration, since the value of x of $SiN_x$ which is the current control layer can be controlled only based on the environment (gas flow ratio of nitrogen) during sputtering, film deposition of $SiN_x$ based on the controlled x is easily carried out. In addition, since polycrystalline silicon is used as the target material, a DC sputtering process commonly used in a semiconductor fabrication process is used and therefore is more desirable from the viewpoint of reliability of the film deposition equipment. Further, since the polycrystalline silicon is used as the target material, it is easy to form a large-diameter target having a high purity. For this reason, it is easy to form a $SiN_x$ film having a large areas and containing less impurities (therefore the characteristic is well controlled based on the value of x), and as a result, it is possible to use a large-diameter wafer, for example. Thus, the fabrication method of the memory element which is excellent in terms of quality control and productivity is achieved.

In the method of fabricating the memory element, the step of forming the current control layer comprising $SiN_x$ may be a step of forming the current control layer comprising $SiN_x$ ($0<x\leq0.85$), or a step of forming the current control layer comprising $SiN_x$ ($0.3\leq x\leq0.6$).

In the method of fabricating the memory element, the step of forming α-tungsten may include a step of sputtering using a target comprising tungsten in an argon-containing environment in which the total gas pressure is 0.8 Pa or lower.

In the method of fabricating the memory element, the step of forming α-tungsten may include a step of depositing α-tungsten by CVD.

The fabrication method may further include forming α-W having a bcc structure, as at least one of the first electrode and the second electrode. W is frequently used in semiconductor industry. Therefore, it is possible to provide a fabrication method of the memory elements with applying corrective and preventive maintenance methods of a semiconductor fabrication line, and with the existing equipment used for the film deposition, etching, etc, and process conditions for the equipment to be easily modified to be compatible with production of the element including W, and have high productivity. Furthermore, since W is a material being less susceptible to electromigration, the fabrication method of the memory element with high reliability can be provided.

To solve above mentioned problem, a memory device of the present invention comprises plural memory elements each of which includes: a resistance variable element which switches its electrical resistance value in response to a positive or negative electrical pulse applied thereto and retains the switched electrical resistance value; and a current control element for controlling a current flowing when the electrical pulse is applied to the resistance variable element; wherein the current control element includes a first electrode; a second electrode; and a current control layer sandwiched between the first electrode and the second electrode; and wherein the current control layer comprises $SiN_x$, and at least one of the first electrode and the second electrode comprises α-tungsten; plural bit lines: and plural word lines which three-dimensionally cross the plural bit lines, respectively; wherein each of the plural memory elements includes a series circuit including the resistance variable element and the current control element; and wherein each of the plural memory elements is arranged at a section where associated one of the bit lines and associated one of the word lines three-dimensionally cross each other, and in each section, one end of the series circuit is connected to associated one of the bit lines and the other end of the series circuit is connected to associated one of the word lines.

In the above memory device, the current control layer may comprise $SiN_x$ ($0<x\leq0.85$), or the current control layer may comprise $SiN_x$ ($0.3\leq x\leq0.6$).

The above and further objects, features and advantages of the present invention will more fully be apparent from the following detailed description with reference to the accompanied drawings.

Effects of the Invention

A current control element, memory element and fabrication methods thereof have advantages that they can provide a current control element, memory element and fabrication methods thereof which are capable of writing data without problem, i.e., capable of preventing write disturb even when electrical pulses with difference polarities are applied and capable of feeding a large current in a resistance variable element

BRIEF DESCRIPTION OF THE DRAWINGS

FIG. 12 is a graph showing measurement result of a current-voltage characteristic of a current control element including a current control layer made of 10 nm-thick $SiN_x$ and a pair of electrodes made of W, in which FIG. 12(a) is a graph in the case where x is 0.3 and FIG. 12(b) is a graph in the case where x is 0.6.

FIG. 17 is a view schematically showing a current-voltage characteristic of a current control element, in which FIG. 17(a) is a view of a current-voltage characteristic of a two-terminal element such as a varistor, and FIG. 17(b) is a view of a current-voltage characteristic of a Schottky diode.

MODE FOR CARRYING OUT THE INVENTION

Hereinafter, a best mode for carrying out the invention will be described in detail with reference to the drawings.

Figure 1:
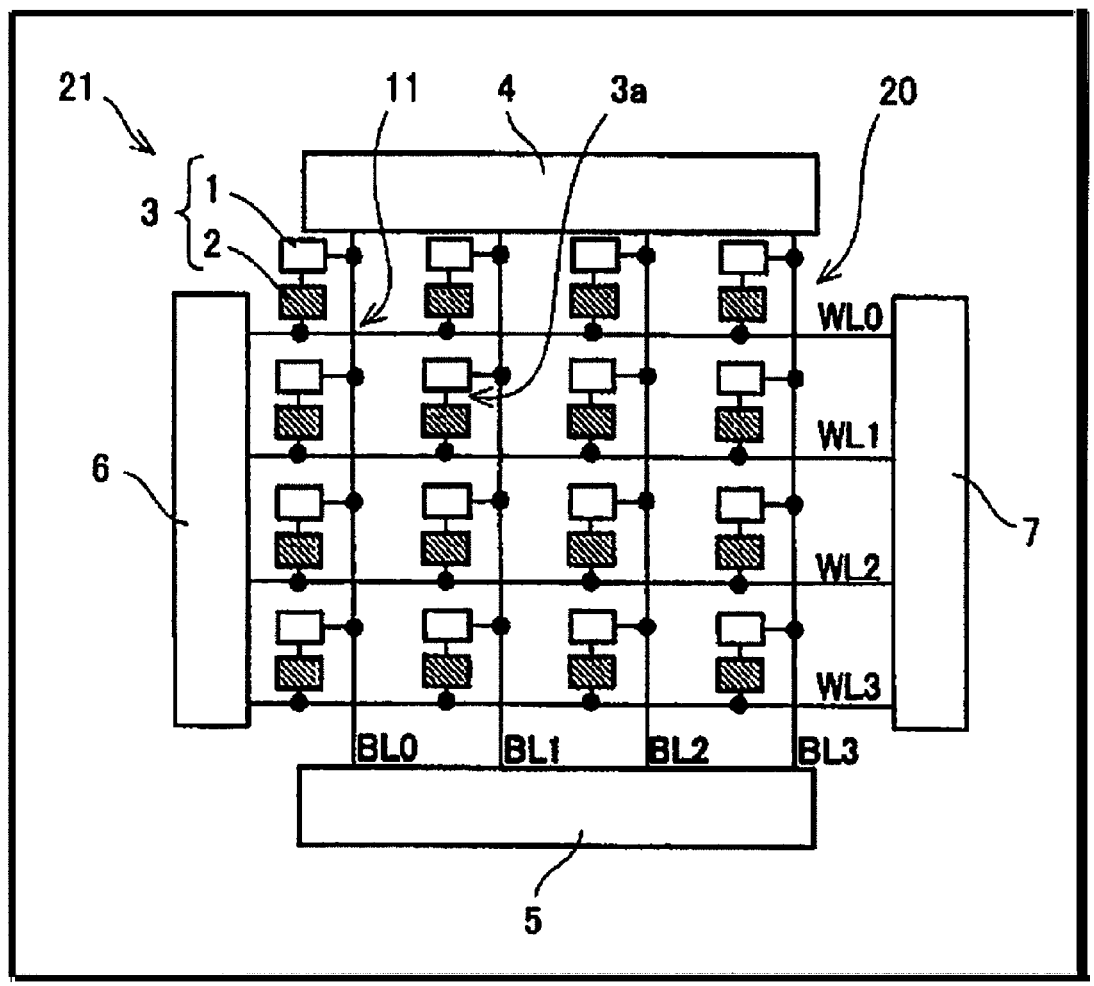
FIG. 1 is a block diagram schematically showing a configuration of a memory device including a current control element according to Embodiment of the present invention.

FIG. 1 is a block diagram schematically showing a configuration of a memory device including memory elements according to Embodiment of the present invention. In FIG. 1, only the constituents required to explain the present invention are illustrated and other constituents are omitted.

As shown in FIG. 1, a memory device 21 according to this Embodiment is a cross-point memory device. The memory device 21 includes a memory element array 20 and a peripheral circuit (e.g., bit line decoder 4, read circuit 5, word line decoders 6 and 7) for driving the memory element array 20.

Although an actual memory element array typically includes plural bit lines and plural word lines, the memory element array 20 is illustrated herein to include four bit lines BL0~BL3 and four word lines WL0~WL3 for easier understanding of the configuration of the memory element array, as shown in FIG. 1.

In the memory element array 20 according to this Embodiment, the four bit lines BL0~BL3 and the four word lines WL0~WL3 are arranged so as to three-dimensionally cross each other at a right angle. Memory elements 3 (so-called cells) are respectively arranged at three-dimensional cross sections 11 of the four bit lines BL0~BL3 and the four word lines WL0~WL3. In other words, in the memory element array 20 of this Embodiment, the memory elements 3 are arranged in matrix consisting of four rows and four columns. Each memory element 3 has a series circuit including a resistance variable element 1, and a current control element 2 connected in series with the resistance variable element 1. One end and the other end of the series circuit are respectively connected to associated one of the bit lines BL0~BL3 and to associated one of the word lines WL0~WL3 corresponding to associated one of three-dimensional cross sections 11.

As shown in FIG. 1, one ends of the four bit lines BL0~BL3 are connected to the bit line decoder 4. The other ends of the bit lines BL0~BL3 are connected to the read circuit 5. Both ends of the four word lines WL0~WL3 are connected to the word line decoders 6 and 7.

By providing the two word line decoders 6 and 7 at both ends of the word lines WL0~WL3, the word lines WL0~WL3 are connected to the word line decoder 6 and to the word line decoder 7 alternately, for example, in such a manner that even-numbered word lines are connected to the word line decoder 6 and the odd-numbered word lines are connected to the word line decoder 7. In this Embodiment, such a connecting configuration is used, although this is not shown specifically in FIG. 1. With such a configuration, a spacing between adjacent ones of the word lines WL0~WL3 can be reduced and flexibility of circuit layout of the word line decoders 6 and 7 can be improved.

In the memory device 21 having the above configuration, the bit line decoder 4 selects one of the bit lines BL0~BL3 in accordance with a command from a controller (not shown). The word line decoder 6 or 7 selects one of the word lines WL0~WL3 in accordance with the command from the controller. The bit line decoder 4 and the word line decoder 6 or 7 feed an electrical pulse (to be precise, voltage pulse) whose voltage is a predetermined write voltage Vw or an electrical pulse (to be precise, voltage pulse) whose voltage is a predetermined read voltage Vr, between the selected bit line of the bit lines BL0~BL3 and the selected word line of the word lines WL0~WL3, depending on whether the command from the controller is a command for writing of data (hereinafter simply referred to as "write") or is a command for reading of data (hereinafter simply referred to as "read"). On the other hand, in read, the read circuit 5 detects the value of a current flowing in the selected bit line of the bit lines BL0~BL3, reads data stored in the selected memory element 3, and outputs the data to the controller. The peripheral circuit such as bit line decoder 4, the read circuit 5, the word line decoders 6 and 7 as shown in FIG. 1 are constituted by, for example, MOSFETs. The memory device 21 is typically fabricated by a semiconductor fabrication process.

In this Embodiment, the first and second electrodes 32 and 31 (see FIG. 2) constituting the current control element 2 are connected to one electrode (not shown) of the resistance variable element 1 and one of the word lines WL0~WL3 such that either one of the first and second electrodes 32 and 31 is connected to the resistance variable element 1 and the other of these electrodes is connected to the word line. The other electrode (not shown) of the resistance variable element 1 is connected to one of the bit lines BL0~BL3. But, the configuration is not limited to that. For example, the first electrode 32 (or second electrode 31) of the current control element 2 may also serve as one electrode of the resistance variable element 1.

Next, the configuration of the resistance variable element constituting the memory element according to this Embodiment will be described in detail.

The resistance variable element 1 of FIG. 1 has a structure in which a thin layer (not shown: hereinafter the thin layer is referred to as "resistance variable thin layer") made of a resistance variable material is sandwiched between a pair of opposing electrodes (not shown). When a predetermined electrical pulse is applied to the resistance variable thin layer, the resistance variable thin layer switches between a predetermined low-resistance state (hereinafter this state is simply referred to as "low-resistance state") and a predetermined high-resistance state (hereinafter this state is simply referred to as a "high-resistance state"). The resistance variable thin layer retains the switched state unless a predetermined electrical pulse is applied thereto. In this Embodiment, "0" and "1" of the binary data are allocated to the low-resistance state and the high-resistance state such that either one of "0" and "1" corresponds to either one of these resistance states and the other of these data corresponds to the other resistance state, and electrical pulses with different polarities are applied to the resistance variable thin layer to allow the resistance variable thin layer to switch between the low-resistance state and the high-resistance state. As a resistance variable material for forming the resistance variable thin layer, a perovskite metal oxide, oxide of typical metal element, or transition metal, etc, may be used.

To be specific, as a material for forming the resistance variable thin layer, there are $Pr_{(1-x)}Ca_xMnO_3(0<x<1)$, $TiO_2$, $NiO_x$ (x>0), $ZrO_x$ (x>0), $FeO_x$ (x>0), $Cu_xO$ (x>0), $TaO_x$ (0<x<2.5), or the like, substitutes of these, mixtures of these, laminates of these, etc. It should be noted that the resistance variable material is not limited to the above-mentioned resistance variable materials.

Next, the fabrication method of the resistance variable element constituting the memory element according to Embodiment of the present invention will be described.

When fabricating the resistance variable element, an electrode (not shown: hereinafter this electrode is referred to as "lower electrode"), a resistance variable thin layer, and an electrode (not shown: hereinafter this electrode is referred to as "upper electrode") forming a pair with the lower electrode, are deposited over the main surface of a specified substrate in this order. The film deposition condition of the lower electrode deposited initially depends on an electrode material used, etc. For example, when platinum (Pt) is used as the material of the lower electrode, the DC magnetron sputtering process is used, the pressure at film deposition is set to 0.5 Pa, the DC power is set to 200W, the argon (Ar) flow rate is set to 6 sccm, and the film deposition time is adjusted so that the thickness is from 20 nm to 100 nm. It should be noted that the deposition method of the lower electrode is not limited to the sputtering process but may be so-called chemical vapor deposition (CVD) process, a spin coating process, etc.

Next, the resistance variable thin layer is deposited over the main surface of the lower electrode. The deposition method of the resistance variable thin layer also depends on the material used for the resistance variable thin layer. For example, when $FeO_x$ (iron oxide) is used as the material of the resistance variable thin layer, an iron oxide target is subjected to sputtering under Ar atmosphere using an RF magnetron sputtering process, to form an $FeO_x$ thin film. To be specific, the pressure is set between 0.5 Pa and 2 Pa, the substrate temperature is set between 20 degrees C. and 300 degrees C., the Ar flow rate is set to 20 sccm, the RF power is set between 200W and 300W, and the film deposition time is adjusted so that the thickness of the $FeO_x$ film is from 20 nm to 100 nm. It should be noted that the film deposition method of the resistance variable thin layer is not limited to the sputtering process, but may be so-called the CVD process, a spin coating process, etc.

Finally, the upper electrode is deposited over the main surface of the resistance variable thin layer by the sputtering process. The film deposition condition of the upper electrode depends on the material used for the upper electrode. For example, when Pt is used for the material of the upper electrode, similarly to the deposition of the lower electrode, the DC magnetron sputtering is used, the pressure at film deposition is set to 0.5 Pa, the DC power is set to 200 W, the Ar flow rate is set to 6 sccm, and the film deposition time is adjusted so that the thickness is from 20 nm to 100 nm. It should be noted that the deposition method of the upper electrode is not limited to the sputtering process but may be so-called the CVD process, the spin coating process, etc.

Next, the feature of the configuration of the current control element according to this Embodiment will be described in detail.

In this Embodiment, the current control element has a structure in which a current control layer is sandwiched between a pair of opposing electrodes. This structure has substantially the same structure as that of the above mentioned MIM diode or MSM diode. The current control element of this Embodiment exhibits a nonlinear electrical resistance characteristic and has a current-voltage characteristic which is substantially symmetric with respect to the polarity of the applied voltage. Therefore, the current control element of this Embodiment is capable of preventing write disturb even when electrical pulses with different polarities are applied.

The current-voltage characteristic of the current control element of this Embodiment significantly depends on a potential barrier between the electrodes and the adjacent current control layer. Since the potential barrier induces a current steering property, a nonlinear electrical resistance characteristic is obtained. In this Embodiment, a configuration of the current control element will be described which can flow a large current by controlling the potential barrier to a certain height or lower while effectively utilizing such a characteristic.

Hereinafter, the specific structure of the current control element of this Embodiment will be described with reference to the drawings.

Figure 2:
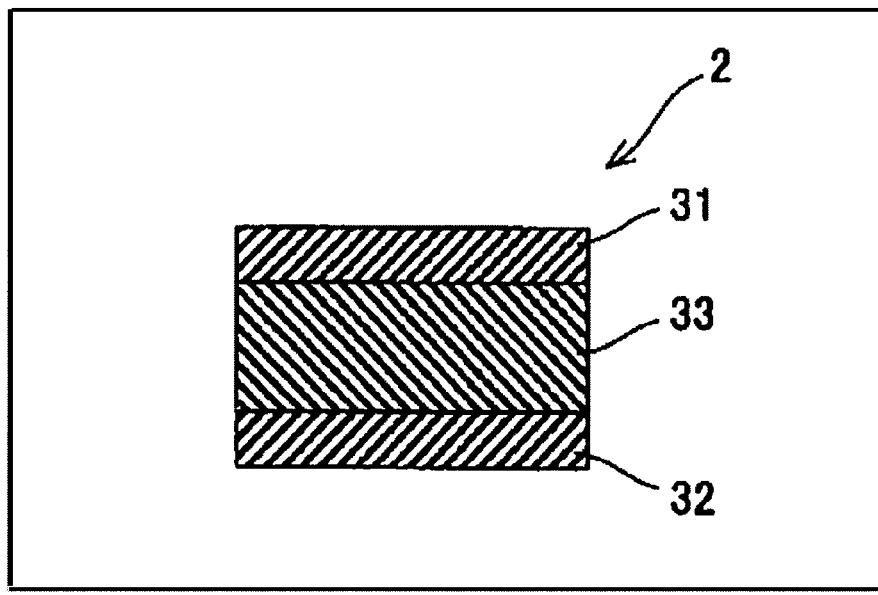
FIG. 2 is a cross-sectional view schematically showing a structure of a current control element according to Embodiment of the present invention.

FIG. 2 is a cross-sectional view schematically showing a structure of the current control element according to Embodiment of the present invention.

As shown in FIG. 2, a current control element 2 includes the first electrode 32, the second electrode 31, and the current control layer 33 sandwiched between the first electrode 32 and the second electrode 31.

In this Embodiment, as the first electrode or the second electrode, tungsten (W) is used. W is frequently used in semiconductor industry. Therefore, it is possible to provide current control elements with applying corrective and preventive maintenance methods of a semiconductor fabrication line, and with the existing equipment used for the film deposition, etching, etc, and process conditions for the equipment to be easily modified to be compatible with production of the element including W, and have high productivity. Further, W is a material being less susceptible to electromigration, and therefore is more desirable to improve reliability of the current control element. The inventors of the present application studied intensively and discovered that W is used for the electrode material and the current control element 2 is desirably fabricated by selecting α-W having a body-centered cubic lattice structure (bcc structure), from among W used for the electrode materials, in order to sufficiently increase the density of the current flowed in the conductive state. The electrode dependency of the current control element characteristic which occurs when W is used for the electrode will be described in detail later.

In this Embodiment, the current control layer 33 comprises $SiN_x(0<x\leq0.85)$.

Silicon compound such as $SiN_x$ forms a tetrahedrally-coordinated amorphous semiconductor having a four-coordinated bond. The tetrahedrally-coordinated amorphous semiconductor basically has a structure which is close to a structure of single crystal silicon or germanium, and therefore has a feature that a difference in structure generated by introducing an element other than silicon is easily reflected in a physical property. For this reason, by applying the silicon compound to the current control layer 33, the physical property of the current control layer 33 is easily controlled through a structural control of the silicon compound. This results in an advantage that the potential barrier between the current control layer 33 and the first and second electrodes 32 and 31 is more easily controlled.

Especially, when $SiN_x$ is used for the current control layer 33, a bandgap can be controlled continuously by changing nitrogen content in $SiN_x$. This desirably makes it possible to control the potential barrier between the first and second electrodes 32 and 31 and the adjacent current control layer 33.

Further, $SiN_x$ contains, as components, silicon and nitrogen which are generally used in the semiconductor fabrication process and widely used in current semiconductor fabrication process. For this reason, contamination due to the introduction of $SiN_x$ will not take place, which is favorable considering the corrective and preventive maintenance of a semiconductor fabrication line. In addition, in terms of fabrication process, the existing equipment can be modified to be compatible with film deposition, etching, etc of $SiN_x$, and the existing film deposition conditions or etching conditions can be modified to be compatible with the process conditions for production of the element including $SiN_x$.

To form a cross-point memory device which has a feature that data can be surely written to the device by applying electrical pulses with different polarities, it is required that the current control element be "element exhibiting a non-linear electrical resistance characteristic and having a current-voltage characteristic which is substantially symmetric to the polarity of an applied voltage" and "element capable of flowing a current with a density required to write data to the resistance variable element." Also, for the purpose of miniaturization or high-dense integration of the memory elements, desirably, the current control element can be miniaturized and a variation in its characteristic is less.

In view of the above, among the two-terminal elements (e.g., MIM diode, MSM diode, varistor, etc) which are applicable as the current control elements, the MIM diode has a structure in which an insulator is sandwiched between metals, and therefore may be essentially unsuitable to the use in which a large current is supplied steadily. It is known that the characteristic of the varistor originates in a crystal grain boundary. However, since characteristic variation occurs in the varistor unavoidably due to an existence of grain-diameter distribution of crystals, and therefore its operation characteristic in association with miniaturization inevitably varies. In view of this respect, it may be considered that the varistor is undesirable for use as the current control element. It may be considered that when an amorphous semiconductor is used, the MSM diode does not cause characteristic variations due to the semiconductor structure and therefore can avoid a variation in operation characteristic in association with miniaturization. However, the use of the MSM diode which can flow a large current steadily has not been reported yet.

When $SiN_x$ is applied to the current control layer 33, as described above, the electrical conductive characteristic of the current control layer 33 changes greatly depending on the value of x. To be specific, $SiN_x$ is an insulator in a stoichiometric composition (x=1.33 i.e., $Si_3N_4$) but gradually turns to behave as a semiconductor as the ratio of nitrogen decreases (i.e., the value of x decreases) from this stoichiometric composition. Therefore, by properly controlling the value of x, the current control element 2 having the current control layer 33 can serve as the MSM diode. The electrical resistance of the MSM diode is very high when the applied voltage is in a range which is not larger than the first critical voltage and not smaller than the second critical voltage, but it drastically decreases when the applied voltage is larger than the first critical voltage or smaller than the second critical voltage. That is, the MSM diode has a non-linear electrical resistance characteristic in which a large current flows (hereinafter the state where a large current flows is referred to as "conductive state") when the applied voltage is larger than the first critical voltage or smaller than the second critical voltage. In this Embodiment, by arranging the current control element 2 having such an electrical resistance characteristic of the MSM diode in series with the resistance variable element 1, a leakage current is surely controlled.

After intensive study, the inventors of the present application discovered that by controlling the value of x of $SiN_x$ to a value within a predetermined range, it is possible to fabricate the current control element 2 which is allowed to exhibit an electrical resistance characteristic similar to that of the MSM diode and make the density of the current flowed in the conductive state sufficiently higher. A proper value of x of $SiN_x$ will be described in detail later.

Next, the fabrication method of the current control element constituting the memory element according to Embodiment of the present invention will be described.

When fabricating the current control element, initially, W is deposited over the main surface of a specified substrate, as the first electrode 32. W is deposited using the DC magnetron sputtering under the condition in which the substrate temperature is set between 20 degrees C. and 25 degrees C., the Ar flow rate is set to 50 sccm, the DC power is set between 200W and 300W, the pressure at film deposition is set between 0.4 Pa and 0.8 Pa, and the film deposition time is adjusted so that the thickness is from 20 nm and 100 nm.

Next, $SiN_x$ film is deposited over the main surface of the first electrode 32 as the current control layer 33. In the film deposition, for example, polycrystalline silicon target is subjected to sputtering (so-called reactive sputtering) under an atmosphere of a mixture gas containing Ar and nitrogen. In typical film deposition conditions, the pressure is set between 0.08 Pa and 2 Pa, the substrate temperature is set between 20 degrees C. and 300 degrees C., the nitrogen gas flow ratio (ratio of nitrogen flow rate to a total flow rate of Ar and nitrogen) is set between 0% and 40%, the DC power is set between 100W and 1300W, and the film deposition time is adjusted so that the thickness of $SiN_x$ film is from 5 nm to 20 nm.

Finally, W is deposited over the main surface of the current control layer 33 as the second electrode 31. W is deposited using the DC magnetron sputtering under the condition in which the substrate temperature is set between 20 degrees C. and 25 degrees C., the Ar flow rate is set to 50 sccm, the DC power is set between 200W and 300W, the pressure at film deposition is set between 0.4 Pa and 0.8 Pa, and the film deposition time is adjusted so that the thickness is from 20 nm to 100 nm.

In this Embodiment, the $SiN_x$ film as the current control layer 33 is deposited using so-called reactive sputtering process in which a polycrystalline silicon target is subjected to sputtering under an atmosphere of a mixture gas containing Ar and nitrogen. When the sputtering process is performed using the silicon target, the electrical resistance of the target is high if the single crystal silicon is used as the target. Therefore, the DC sputtering process conventionally and commonly used in a semiconductor fabrication process cannot be used in that case, and there is a need for film deposition equipment for the RF sputtering process. In addition, if the single crystal silicon is used, it is difficult to form a large-diameter target having a high purity. On the other hand, if the polycrystalline silicon is used as a target material, the DC sputtering process conventionally and commonly used in a semiconductor fabrication process. This is desirable in terms of reliability of equipment. In addition, if the polycrystalline silicon is used, it is easy to form a large-diameter target having a high purity. For this reason, it is easy to form a $SiN_x$ film having a large area and containing less impurity (therefore the characteristic is well controlled based on the value of x) and as a result, it is possible to use a large-diameter wafer. Thus, a fabrication method which is excellent in terms of quality control and productivity is achieved.

In this Embodiment, the value of x of $SiN_x$ film may be suitably changed by changing the condition (a gas flow ratio between Ar and nitrogen, etc) for sputtering the target made of the polycrystalline silicon.

Figure 3:
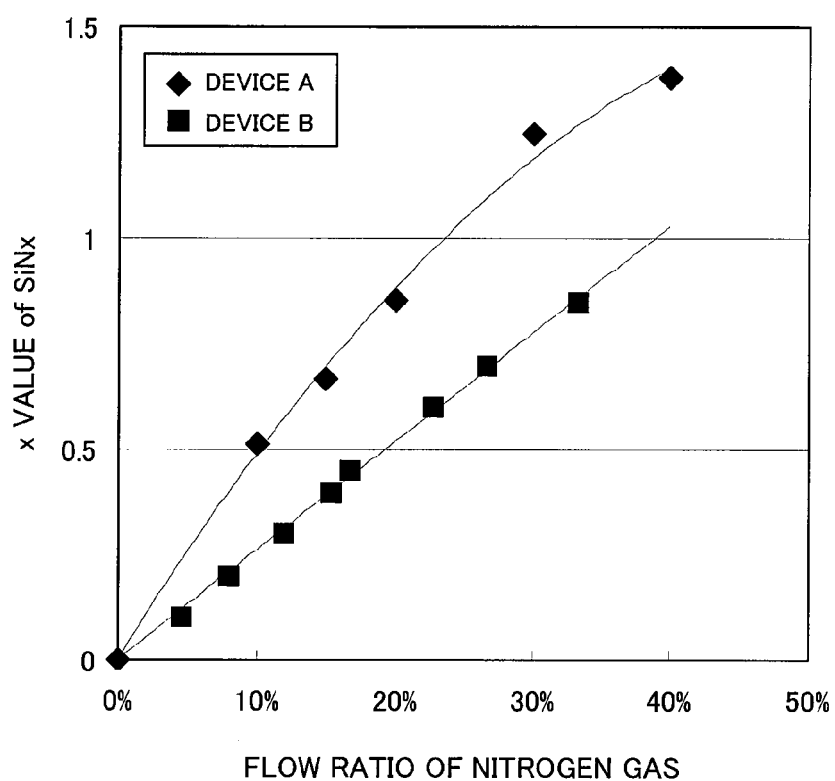
FIG. 3 is a correlation diagram showing Rutherford Backscattering Spectrometry measurement result of x values of plural $SiN_x$ films deposited by changing a nitrogen gas flow ratio.

FIG. 3 is a correlation diagram showing Rutherford Backscattering Spectrometry measurement result of x values of plural $SiN_x$ films deposited by changing a nitrogen gas flow ratio. In FIG. 3, a horizontal axis indicates a nitrogen gas flow ratio (ratio of nitrogen flow rate to a total flow rate of Ar and nitrogen), and a vertical axis indicates the values of x of the $SiN_x$ films. FIG. 3 shows data regarding the $SiN_x$ films deposited using two kinds of DC sputtering film deposition tools (hereinafter referred to as tool A and tool B). The data associated with the tool A are measurement results of the samples deposited using a 150 nm-diameter polycrystalline silicon target under the condition in which the pressure was set to 0.4 Pa, the substrate temperature was set to 20 degrees C. and the DC power was set to 300W. The data associated with the tool B are measurement results of the samples deposited using a 300 mm-diameter polycrystalline silicon target under the condition in which a total gas flow rate was set to 15 sccm (in this case, the pressure was from about 0.08 Pa to about 0.1 Pa), the substrate temperature was set to 20 degrees C. and the DC power was set between 1000W and 1300W.

As shown in FIG. 3, by continuously changing the nitrogen gas flow ratio from 0% to 40%, the value of x of the $SiN_x$ film can be changed continuously, in either the case where the tool A is used or the case when the tool B is used. And, by changing the nitrogen content in the $SiN_x$ film based on the nitrogen gas flow ratio, the bandgap can be changed continuously. This makes it possible to properly control the potential barrier height between the first and second electrodes 32 and 31 and the current control layer 33 adjacent to these electrodes. Thus, it is possible to make a density of the current flowed in the current control element 2 in a conductive state sufficiently higher while allowing the current control element 2 to exhibit an electrical resistance characteristic similar to that of the MSM diode.

Hereinafter, result of consideration of the proper value of x of $SiN_x$ will be described.

Figure 4:
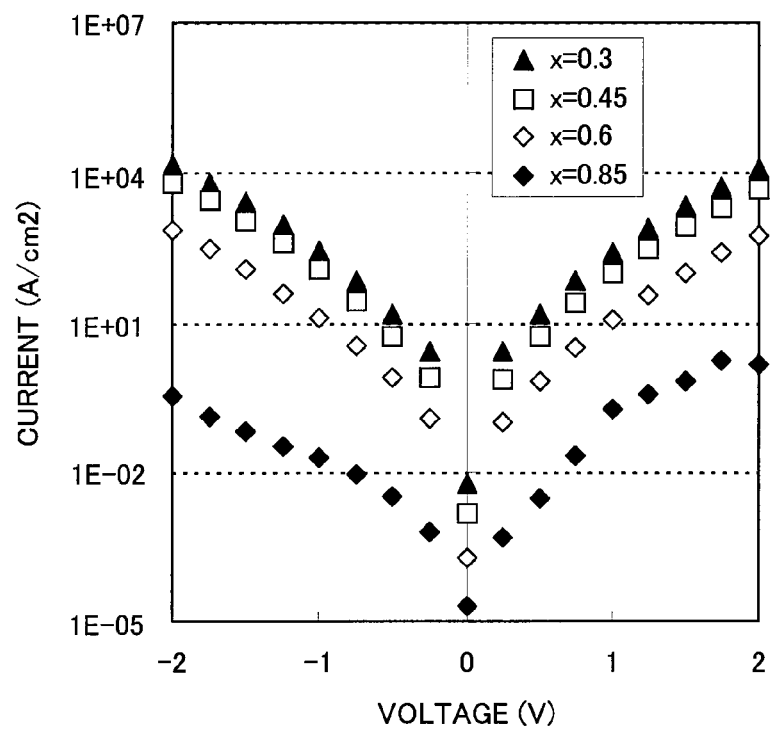
FIG. 4 is a graph showing measurement result of a current-voltage characteristic of a current control element including a current control layer made of 10 nm-thick $SiN_x$ and a pair of electrodes made of W (tungsten).

FIG. 4 is a graph showing measurement result of a current-voltage characteristic of a current control element including a current control layer made of 10 nm-thick $SiN_x$ and a pair of electrodes made of tungsten (W), which measurement is conducted for each 0.25V in a range between −2V and 2V. In FIG. 4, a horizontal axis indicates a voltage applied to the current control element, and a vertical axis indicates an absolute value of a current flowing in the current control element.

In this experiment, W, $SiN_x$ and W were deposited over the main surface of the substrate in this order by sputtering. Then, using a standard lithography and dry etching, the current control element 2 having an electrode area of one square micron meters was fabricated and its current-voltage characteristic was measured. The $SiN_x$ thin film was produced in such a manner that a polycrystalline silicon target was subjected to sputtering under a mixture gas atmosphere containing argon and nitrogen. The value of x of the $SiN_x$ thin film was changed by changing the sputtering condition (gas flow ratio of argon and nitrogen, etc). The values of x were 0.3, 0.45, 0.6, and 0.85, respectively. In this experiment, W was deposited using a DC magnetron sputtering process under the condition in which the substrate temperature was set between 20 degrees C. and 25 degrees C., the Ar flow rate was set to 50 sccm, the DC power was set to 300W, and the pressure at film deposition was set to 0.4 Pa. Thus, α-W was deposited (the electrode dependency of the current control element characteristic which occurs when W is used for the electrode will be described in detail later).

As shown in FIG. 4, it was found out that the current control element 2 including the first and second electrodes 32 and 31 made of W and the current control layer 33 made of $SiN_x$ becomes an element exhibiting a non-linear electrical resistance characteristic and a current-voltage characteristic which is substantially symmetric with respect to the polarity of the applied voltage. Also, as can be seen from FIG. 4, when the $SiN_x$ is applied to the current control layer 33, the potential barrier between the first and second electrodes 32 and 31 and the adjacent current control layer 33 increases in level as the value of x increases, and because of this, the voltage at which the current control element 2 is placed in a conductive state increases.

As can be seen, in a range where the value of x is from 0.3 to 0.85, the absolute value of the current density increases four digit or larger and the current control element 2 has a good bidirectional diode characteristic when the voltage applied between the first electrode 32 and the second electrode 31 is −2V or 2V, as compared to the case where the applied voltage is 0V. When comparison is made for the cases where the same voltage is applied, the current density increases as the value of x decreases. It is presumed that a higher current density is obtained when the value of x is smaller than 0.3. Therefore, when $SiN_x$ is applied to the current control element 33, it is desired that the value of x be larger than 0 and not larger than 0.85. In this configuration, the current control layer 33 serves as a semiconductor and the current control element 2 serves as the MSM diode.

Figure 5:
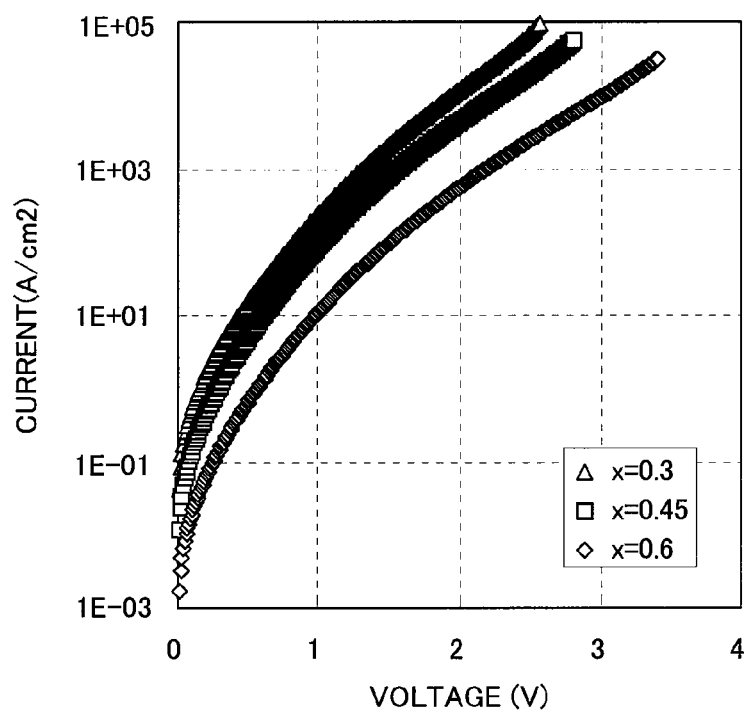
FIG. 5 is a graph showing measurement result of a current-voltage characteristic of a current control element including a current control layer made of 10 nm-thick $SiN_x$ and a pair of electrodes made of W.

FIG. 5 is a graph showing measurement results of the current-voltage characteristics in a range where the applied voltage is larger than that of FIG. 4, for the cases where the values of x of $SiN_x$ are 0.3, 0.45 and 0.6, among the current control elements which are measurement targets shown in FIG. 4. In FIG. 5, the current-voltage characteristic in the case where the polarity of the applied voltage is negative is omitted, for the convenience. As shown in FIG. 5, it was found out that by changing the value of x of $SiN_x$ from 0.3 to 0.6, the voltage which can be applied changes from 2.5V to 3.4V, according to the respective conditions, and the current density higher than 30000A/cm$^2$ is attained in any of the cases. It may be considered that the value of x is desirably set not less than 0.3 and not more than 0.6 to achieve a current density which is higher than 30000A/cm$^2$ in the case of fabricating the current control element including electrodes made of W.

Although the height of the potential barrier between the first and second electrodes 32 and 31 and the adjacent current control layer 33 basically changes based on a work function of the material composing the first and second electrodes 32 and 31 as should be appreciated from the above, the desired potential barrier height can be achieved, by setting the value of x of $SiN_x$ forming the current control layer 33 to a proper value. In other words, in accordance with this Embodiment, by setting the value of x of $SiN_x$ compositing the current control layer 33 to a proper value, the electrical resistance characteristic of the current control element 2 can be controlled to a desired one, and as a result, it is possible to improve flexibility of design of the current control element 2 or the memory element 3.

Next, the electrode material dependency of the current control element characteristic will be described.

Figure 6:
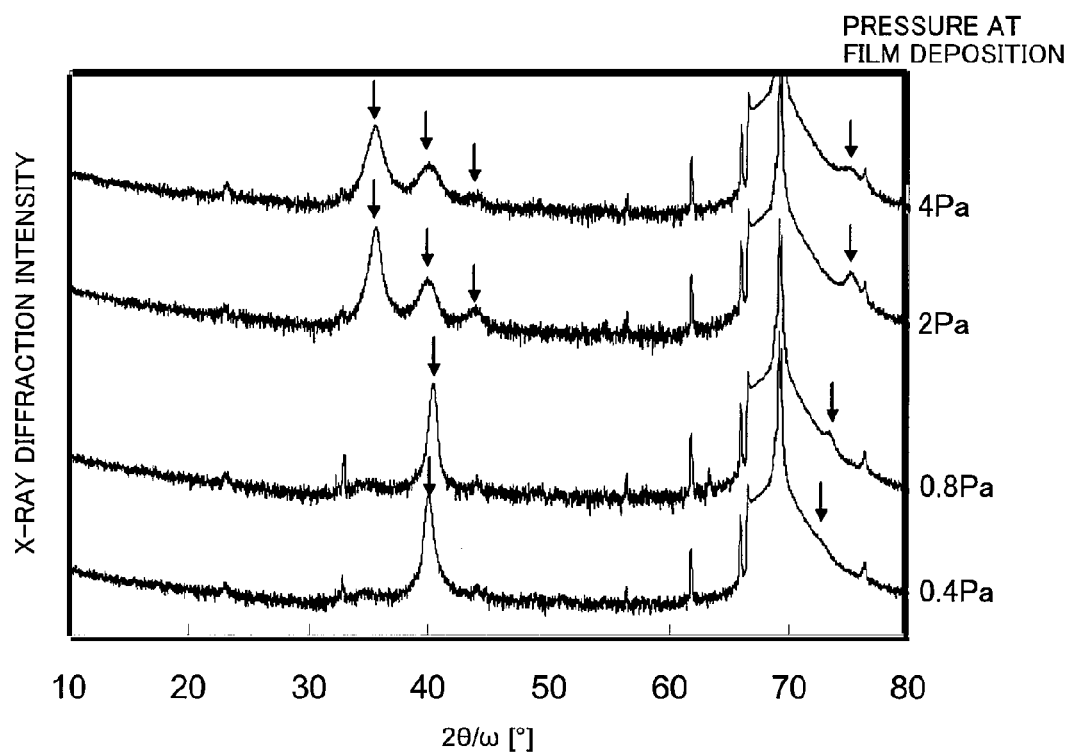
FIG. 6 is a graph showing an X-ray diffraction pattern of W deposited by a DC magnetron sputtering process.

FIG. 6 shows X-ray diffraction patterns of tungsten (W) deposited by the DC magnetron sputtering process and X-ray diffraction intensity in the case where X-ray is caused to enter samples of tungsten thin films at an incidence angle of one degree and a detector angle (θ: angle between extended line of incident X-ray and detector) is changed.

As the samples, W was deposited by subjecting a W target to sputtering under Ar gas atmosphere. The samples were created under the deposition conditions in which the substrate temperature was set between 20 degrees C. and 25 degrees C., the Ar flow rate was set to 50 sccm, the DC power was set between 200W and 300W, and the pressures were set to four conditions which are 0.4 Pa, 0.8 Pa, 2 Pa, and 4 Pa, respectively. With reference to FIG. 6, the structure of W film is different depending on the pressure at film deposition. When the pressure at film deposition is 0.4 Pa or 0.8 Pa, the X-ray diffraction pattern has a peak group (two peaks of 40.3 degrees and 73.2 degrees which are indicated by "↓" in FIG. 6) resulting from α-tungsten (α-W). From this fact, it may be presumed that W is formed by a thin film made of α-W having a face-centered cubic lattice structure. In contrast, when the pressure at film deposition is 2 Pa or 4 Pa, the peak group resulting from α-W is small or otherwise disappears, whereas four peaks of 35.5 degrees, 39.9 degrees, 43.9 degrees and 75.2 degrees resulting from β-tungsten (β-W) having A15 structure appear and are large, as indicated by "↓" in FIG. 6. From this fact, it may be presumed that the W thin films are mainly composed of β-W.

Although the samples of α-W and β-W are analyzed by the X-ray diffraction method, they can be analyzed by an electron beam diffraction pattern using a transmission electron microscope.

Figure 7:
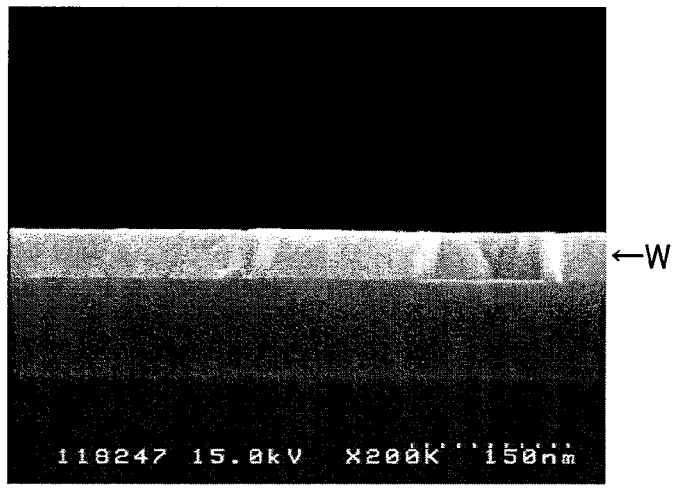
FIG. 7(a) is a SEM observation photograph of the cross-section of a W film.
FIG. 7(b) is a SEM observation photograph of a top view of the W film, when viewed from obliquely upward.
Figure 7:
Figure 8:
FIG. 8(a) is a SEM observation photograph of the cross-section of a W film.
FIG. 8(b) is a SEM observation photograph of a top view of the W film, when viewed from obliquely upward.
Figure 8:
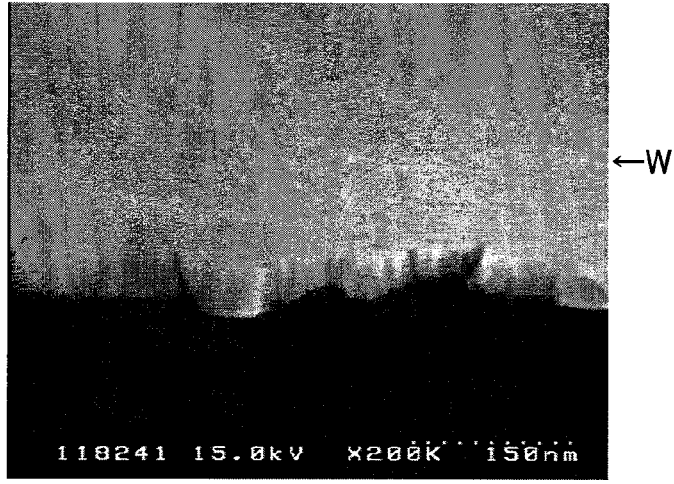
Figure 9:
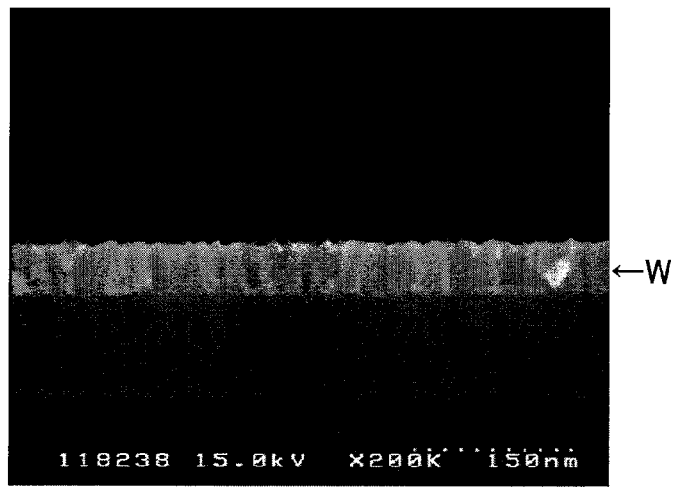
FIG. 9(a) is a SEM observation photograph of the cross-section of a W film.
FIG. 9(b) is a SEM observation photograph of a top view of the W film, when viewed from obliquely upward.
Figure 9:
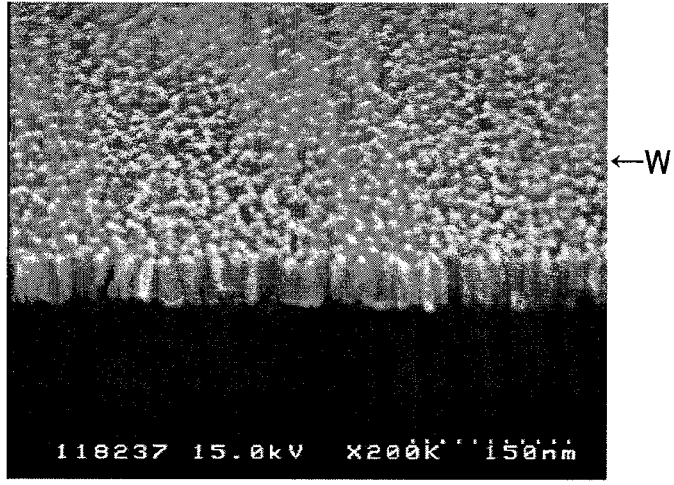
Figure 10:
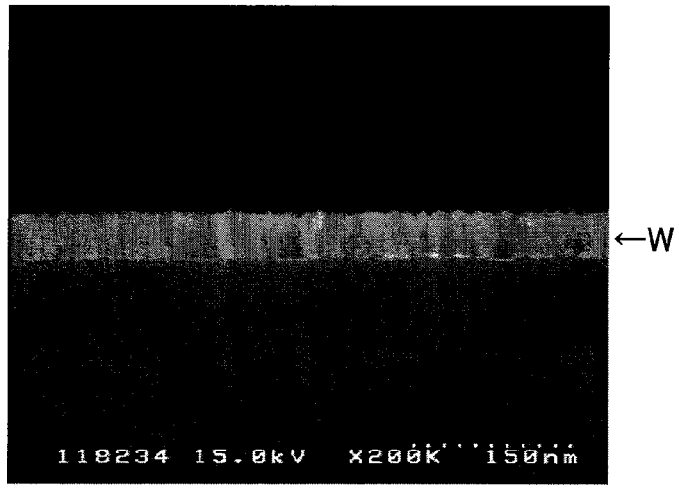
FIG. 10(a) is a SEM observation photograph of the cross-section of a W film.
FIG. 10(b) is a SEM observation photograph of a top view of the W film, when viewed from obliquely upward.
Figure 10:
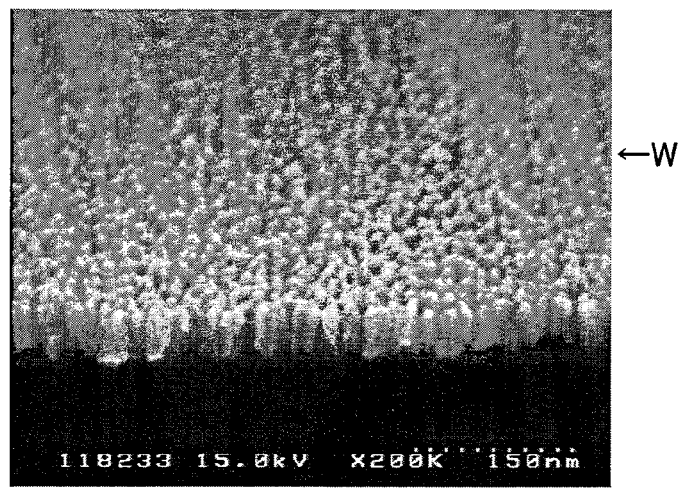

FIGS. 7(*a*) and 7(*b*), FIGS. 8(*a*) and 8(*b*), FIGS. 9(*a*) and 9(*b*), and FIGS. 10(*a*) and 10(*b*) are SEM photographs of about 50 nm-thick W films which are deposited under the above mentioned four conditions. FIG. 7(*a*), FIG. 8(*a*), FIG. 9(*a*), and FIG. 10(*a*) are photographs taken in the SEM observation of the cross-sections of the W films when the pressures at film deposition are 0.4 Pa, 0.8 Pa, 2 Pa, and 4 Pa, respectively. FIG. 7(*b*), FIG. 8(*b*), FIG. 9(*b*), and FIG. 10(*b*) are photographs taken in the SEM observation of the surfaces of W films from obliquely upward when the pressures at film deposition are 0.4 Pa, 0.8 Pa, 2 Pa, and 4 Pa, respectively. In FIGS. 7 to 10, the W films are indicated by "←W." From these photographs, the structure of the W film is different depending on the pressure at film deposition, which is also shown in FIG. 6. It is observed that W has a dense film structure and has a flat surface when the pressure at film deposition is 0.4 Pa (FIG. 7) or 0.8 Pa (FIG. 8) (i.e., the film is composed of α-W). In contrast, it is observed that the W film has a columnar structure and has a concave-convex surface when the pressure at film deposition is 2 Pa (FIG. 9) or 4 Pa (FIG. 10).

Figure 11:
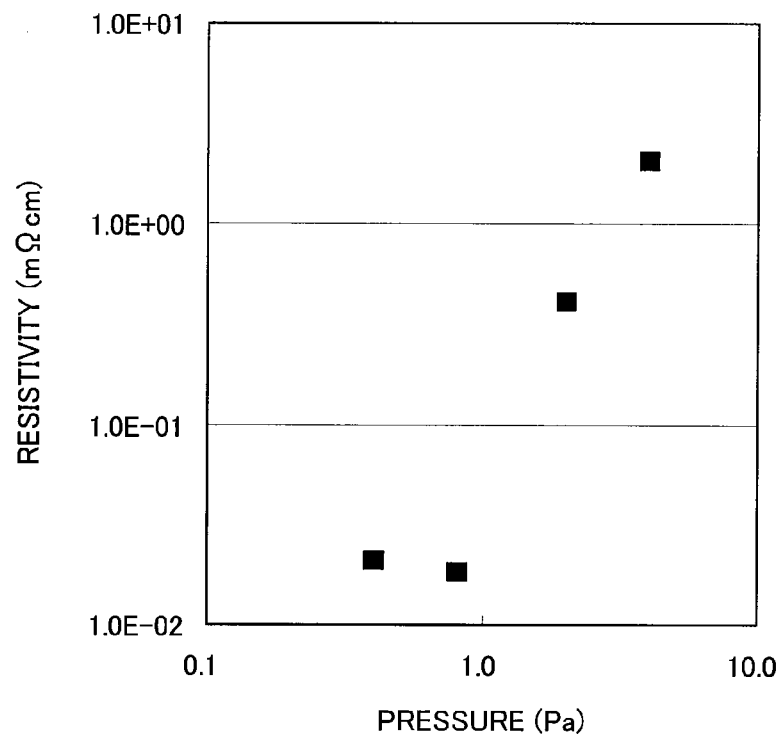
FIG. 11 is a graph showing measurement results of resistivities of four kinds of W films.

FIG. 11 shows measurement results of the resistivities of the above four kinds of W films. Reflecting the structural difference shown in FIG. 6 or FIGS. 7 to 10, it can be seen that the resistivity of the W film is different depending on the pressure at film deposition. To be specific, as shown in FIG. 11, the resistivity is about $2 \times 10^{-2}$ mΩcm when the pressure at film deposition is 0.4 Pa or 0.8 Pa (i.e., the film is composed of α-W), while the resistivity is about $4 \times 10^{-1}$ mΩcm when the pressure at film deposition is 2 Pa, and the resistivity is about 2mΩcm when the pressure at film deposition is 4 Pa.

Figure 12:
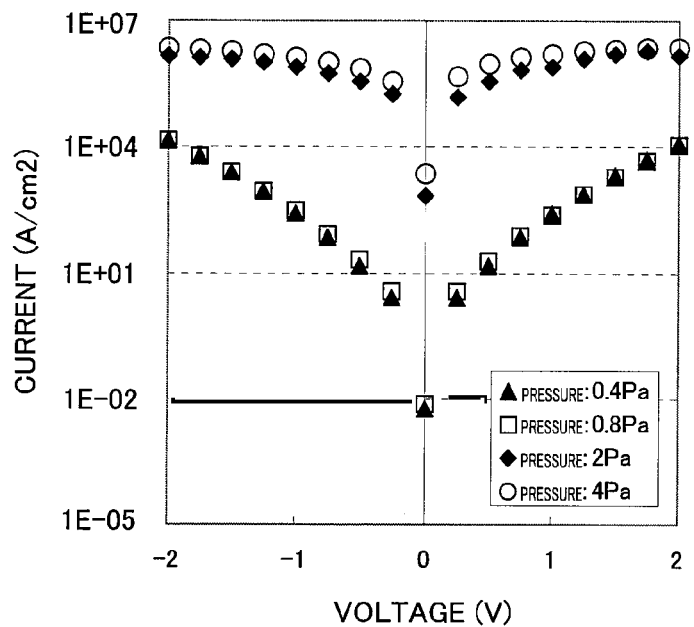
Figure 12:
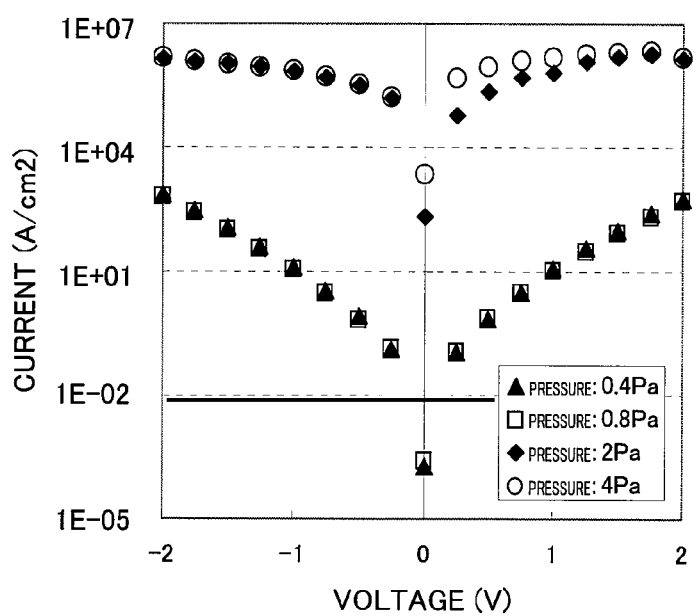

FIGS. 12(*a*) and 12(*b*) are graphs showing measurement results of the current-voltage characteristic of the current control element including a current control layer made of 10 nm-thick $SiN_x$ and the pair of electrodes made of W, which measurement is conducted for each 0.25V, similarly to FIG. 4. In FIG. 12, a horizontal axis indicates a voltage applied to the current control element, and a vertical axis indicates an absolute value of a current flowing in the current control element. FIG. 12(*a*) shows the current-voltage characteristic in the case where the value of x of $SiN_x$ is 0.3 and FIG. 12(*b*) shows the current-voltage characteristic in the case where the value of x of $SiN_x$ is 0.6. Similarly to the samples shown in FIG. 6, the W films are deposited using the above identified four conditions (pressure=0.4 Pa, 0.8 Pa, 2 Pa, 4 Pa). The fabrication method of the current control element 2 is identical to the fabrication method of the current control elements which are measurement targets shown in FIG. 4. When the pressure at film deposition of the W electrode is 0.8 Pa, the current control element exhibits a current-voltage characteristic which is almost identical to the current-voltage characteristic obtained when the pressure at film deposition of the W electrode is 0.4 Pa. From this, it should be understood that the current control element composed of the electrode material of α-W exhibits a good current-voltage characteristic as the current control element and is able to achieve a high current density which is higher than 30000A/cm$^2$ as described with reference to FIG. 5. In contrast, when the pressure at film deposition of the W electrode is 2 Pa or 4 Pa (i.e., the electrode material is mainly composed of β-W), a very large current flows when the voltage applied to the current control element is ±0.5V regardless of the value of x of $SiN_x$ composing the current control layer. In this current control element, a leakage current flowing through the electrodes is very large regardless of the polarity of the applied voltage. This current control element does not exhibit the current-voltage characteristic obtained when the pressure at film deposition of the W electrode is 0.4 Pa or 0.8 Pa. This may be due to the fact that there is no potential barrier between $SiN_x$ composing the current control layer and the W electrode regardless of the value of x due to a difference or the like of the surface conditions of the W films shown in FIGS. 7 to 10, when the pressure at film deposition of the W electrode is 2 Pa or 4 Pa (i.e., the electrode material is mainly composed of β-W). From this, it is therefore desirable to select as the electrode material α-W which has a lower resistivity, exhibits a good current-voltage characteristic when applied to the current control element, and is able to achieve a high current density which is higher than 30000A/cm$^2$ when W is used for the electrode material. From the viewpoint of thermodynamics, α-W is more stable than β-W, and β-W changes into α-W while changing its volume (being contracted) at high temperatures. Therefore, it is desirable to select α-W to improve reliability of the current control element when W is used for the electrode material.

As described above, the sputtering process may be used to deposit α-W. The process is not limited to that. Alternatively, so-called CVD process or the like may be used. When the sputtering process is used to deposit α-W, the W target may be subjected to sputtering under Ar gas atmosphere in which the pressure is 0.8 Pa or lower, as can be seen from the above mentioned experiment result.

Next, the configuration of the memory element of Embodiment of the present invention and a fabrication method thereof will be described.

Figure 13:
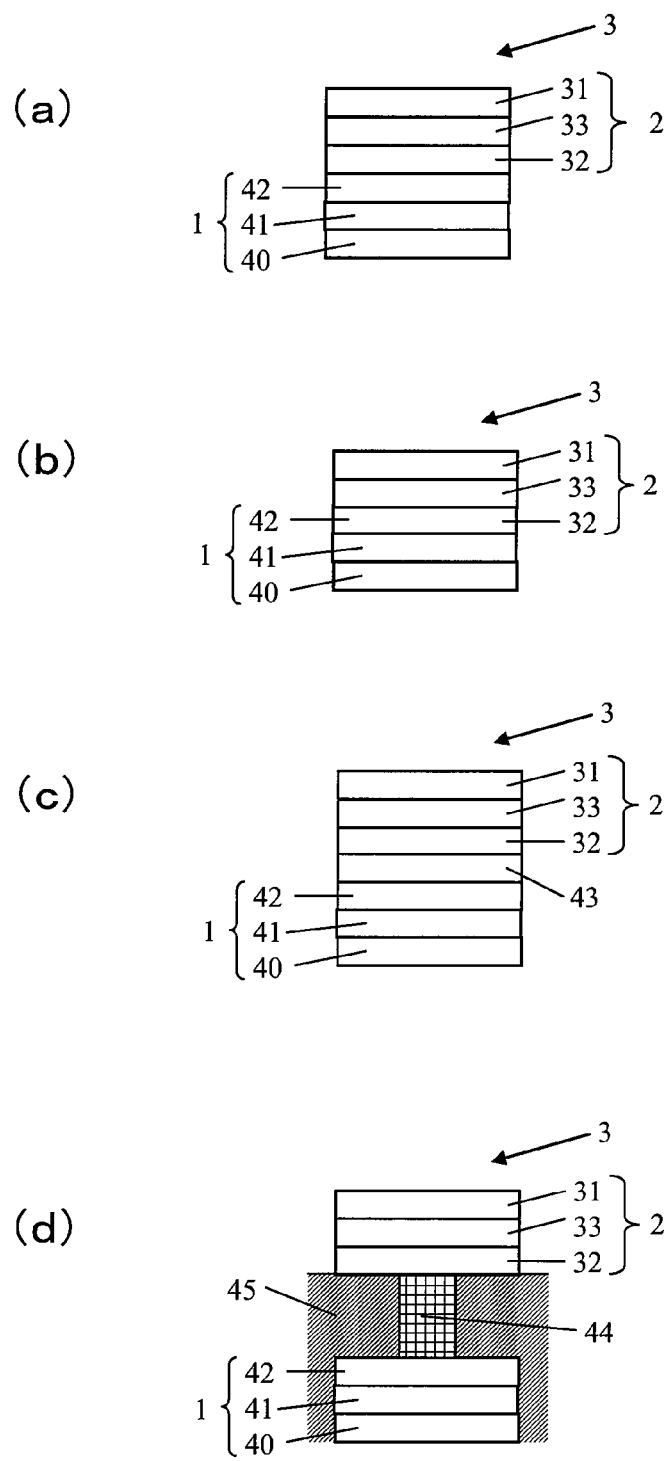
FIGS. 13(a)~13(d) are cross-sectional views schematically showing exemplary configurations of the memory element according to Embodiment of the present invention.

FIG. 13 is a cross-sectional view schematically showing exemplary structures of the memory element of Embodiment of the present invention. FIG. 13(a) shows a memory element 3 including a resistance variable element 1 consisting of the lower electrode 40, the resistance variable thin layer 41, and the upper electrode 42, and the current control element 2 consisting of the first electrode 32, the current control layer 33 and the second electrode 31. The current control element 2 is disposed on the upper electrode 42. The structure of the memory element 3 is not limited to this, but the upper electrode 42 and the first electrode 32 may be a common electrode (FIG. 13(b)), or an adhesion metal layer 43 may be disposed between the upper electrode 42 and the second electrode 32 (FIG. 13(c)). Alternatively, the upper electrode 42 may be connected to the first electrode 32 with a conductive via 44 (FIG. 13(d)). As a similar structure, the conductive via 44 and the first electrode 32 may be formed of the same material (FIG. 14(a) and FIG. 14(b)). By forming the conductive via 44 and the first electrode 32 with W which is easily filled into the via hole, a memory element which is adapted for a miniaturization process is achieved. In further alternative, in the structures shown in FIGS. 13(a) to 13(d) and FIGS. 14(a) and 14(b) in which the current control element 2 overlies the resistance variable element 1, the vertical positional relationship may be reversed so that the current control element 2 underlies the resistance variable element 1 (not shown). It should be noted that the structure of the memory element according to Embodiment of the present invention is not limited to the above mentioned structures.

Figure 15:
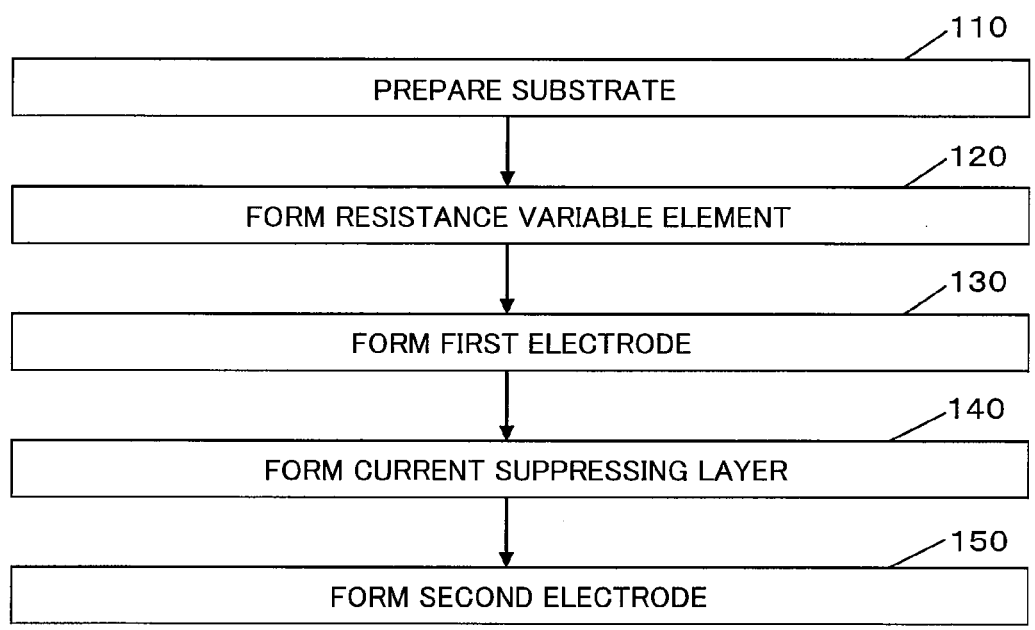
FIG. 15 is a flowchart showing an exemplary fabrication method of the memory element according to Embodiment of the present invention.

FIG. 15 is a flowchart showing an exemplary fabrication method of the memory element of Embodiment of the present invention. For clarity, a series of steps are denoted by reference numerals, which do not always indicate the order of the associated steps. A part of these steps may be omitted or they may be performed concurrently. That is, the order of the series of steps need not be fixed in a strict sense.

Hereinafter, description will be given with reference to FIG. 13(a).

Initially, a substrate is prepared in step 110. In step 120, the lower electrode 40, the resistance variable thin layer 41, and the upper electrode 42 are formed in this order over the main surface of a specified substrate, thereby forming the resistance variable element 1.

Next, in step 130, α-W is formed over the upper electrode of the resistance variable element as the first electrode 32 constituting the current control element 2. In step 130, the sputtering process, the CVD process, etc may be used. When the sputtering process is used in step 130, the DC magnetron sputtering process may be used. As typical film deposition conditions used, the pressure is set between 0.4 Pa and 0.8 Pa, the DC power is set between 200W and 300W, and the Ar flow rate is set to 50 sccm, but the film deposition conditions are not limited to those. The thickness of the second electrode 32 is desirably from about 20 nm to about 100 nm.

It is more desirable to select W (especially α-W) as the first electrode 32, in view of an ON-current of the current control element, reliability of the current control element, and compatibility with a current semiconductor fabrication process. In addition, W has advantages that it is frequently used in various silicon semiconductor steps, and the existing equipment used for the film deposition such as the sputtering process or the CVD process, etching, etc, and process conditions for the equipment are easily modified to be compatible with production of the element including W.

Next, in step 140, $SiN_x$ composing the current control layer 33 is deposited over the first electrode 32. In step 140, the sputtering process, the CVD process, etc may be used. When the sputtering process is used in step 140, a reactive sputtering process for subjecting a polycrystalline silicon target to sputtering under a mixture gas atmosphere of Ar and nitrogen. As typical film deposition conditions used, the pressure is set between 0.08 Pa and 2 Pa, the substrate temperature is set between 20 degrees C. and 300 degrees C., a nitrogen gas flow ratio (ratio of a nitrogen flow rate to a total flow rate of Ar and nitrogen) is set between 0% and 40%, the DC power is set between 100W and 1300W, but the film deposition conditions are not limited to these. The thickness of the $SiN_x$ thin film is desirably from about 5 nm to about 20 nm.

Next, in step 150, α-W is deposited over the upper electrode of the resistance variable element as the second electrode 31 constituting the current control element 2. In step 150, the sputtering process, the CVD process, etc may be used. When the sputtering process is used in step 150, the DC magnetron sputtering process may be used. As typical film deposition conditions used, the pressure is set between 0.4 Pa and 0.8Pa, the DC power is set between 200W and 300W, and the Ar flow rate is set to 50 sccm, but the film deposition conditions are not limited to those. The thickness of the first electrode 31 is desirably from about 20 nm to about 100 nm.

It is more desirable to select W (especially α-W) as the first electrode 31, in view of an ON-current of the current control element, reliability of the current control element, and compatibility with a current semiconductor fabrication process. In addition, W has advantages that it is frequently used in various silicon semiconductor steps, and the existing equipment used for the film deposition such as the sputtering process or the CVD process, etching, etc, and process conditions for the equipment are easily modified for production of the element including W.

Although α-W is desirably selected as the material for the first electrode 32 in step 130 and for the material of the second electrode 31 in step 150 as described above, it may be sometimes desirable to use an electrode material other than W for either one of the first electrode 32 and the first electrode 31, in view of compatibility (e.g., achievement of adhesion of a layer for connecting the current control element 2 to the resistance variable element 1) with the overall fabrication process of the memory element 3. In this case, the electrode material other than W is selected from metals such as Al, Cu, Ti, Ir, Cr, Ni, and Nb, mixtures (alloy) or laminates of these metals, electrically-conductive compounds such as TiN, TiW, TaN, $TaSi_2$, TaSiN, TiAlN, NbN, WN, $WSi_2$, WSiN, $RuO_2$, $In_2O_3$, $SnO_2$ and $IrO_2$, or mixtures or laminates of these electrically-conductive compounds. Among these, the electrode material is desirably selected from materials being less susceptible to electromigration such as transition metals such as Cr, Mo, Nb, Ta, Ti, V, Zr, and Hf, or compounds such as silicide, nitride, carbide, and boride. It should be noted that the electrode material is not limited to these materials as long as the potential barrier between the electrode material and the current control layer 33 induces a current steering characteristic.

Figure 14:
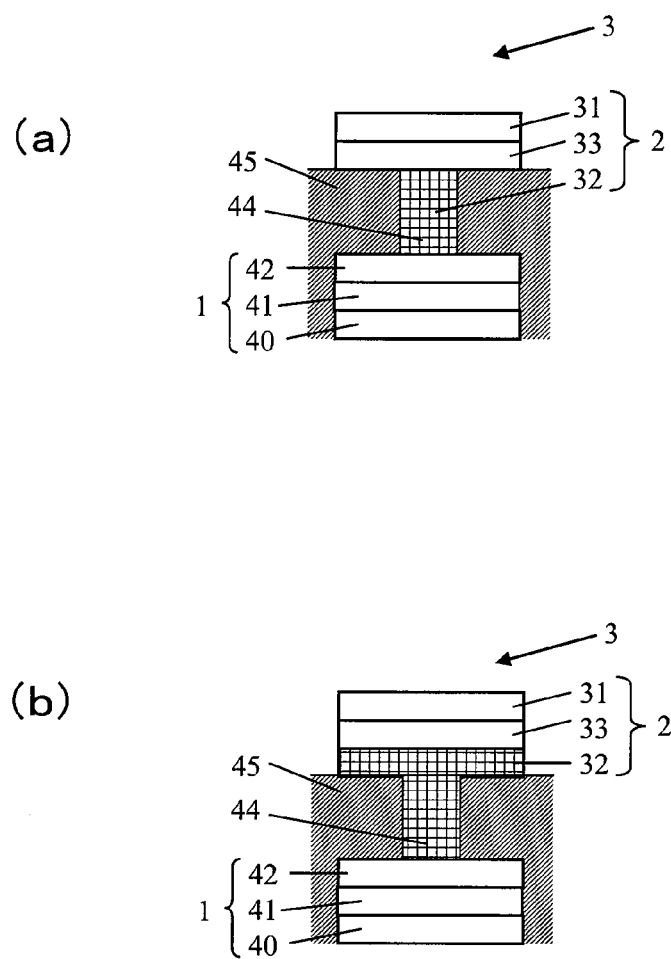
FIGS. 14(a) and 14(b) are cross-sectional views schematically showing exemplary configurations of the memory element according to Embodiment of the present invention.

FIG. 15 is a flowchart explaining an exemplary fabrication method of the memory element shown in FIG. 13(a). Some steps may be added to the steps in the flowchart, or the steps in the flowchart may be modified to fabricate the memory elements shown in FIGS. 13(b) to 13(d) or 14(a) and 14(b). For example, when the memory element shown in FIG. 14(b) is fabricated, step 130 may be omitted from the steps in FIG. 15. When the memory element shown in FIG. 13(c) is fabricated, a step for forming an adhesion metal layer 43 on the upper electrode 40 may be inserted between step 120 and step 130 in FIG. 15. When the memory element shown in FIG. 13(d) is fabricated, a step for covering the resistance variable element 1 with an insulating film 45 from above, a step for forming a via hole (not shown) penetrating through the insulating layer 45 to the upper electrode 42, and a step for filling the via hole (not shown) with the electrode material such as W to form a via wire 44, may be inserted between step 120 and step 130, and in step 130, the second electrode 32 may be formed to be electrically connected to the via wire 44. The above explained fabrication method is an exemplary fabrication method of the memory element and the fabrication method is not limited to those.

Thus, in according with the present invention, by setting the voltages of the electrical pulses so that a voltage of a large absolute value is applied to a resistance variable element to which data should be written and a voltage of a small absolute value is applied to other resistance variable elements, when writing data to memory elements, a large current flows through the resistance variable element to which data should be written and no current flows through other resistance variable elements. Therefore, even when the resistance variable element is formed using a metal oxide, data is surely written to the selected memory element and no data is written to unselected memory elements.

In addition, since the current control element of the present invention exhibits an electrical resistance characteristic similar to the electrical resistance characteristics of the MIM diode, the varistor, etc, with respect to both of positive and negative voltages applied, a leakage current can be surely controlled using write electrical pulses with different polarities. In this manner, the write disturb in the memory device can be surely prevented.

Furthermore, in accordance with the present invention, since the current control element can be fabricated using the semiconductor fabrication process and the fabrication equipment thereof, it can be easily miniaturized and fabricated so as to have higher quality. Thereby, it is possible to achieve reduction of the size and higher quality in the memory element to which data is written by applying electrical pulses of different polarities and the memory device including the memory elements arranged in matrix.

Hereinafter, description will be given of a case where α-W is deposited as the electrode using the CVD process. This method may be used in any of the fabrication methods of the current control element, the memory element and the memory device.

When α-tungsten film is deposited by the CVD process, initially, a tungsten core layer is formed by reducing $WF_6$ gas with $SiH_4$ gas under the condition in which the substrate temperature is set not lower than 400 degrees C. and not higher than 450 degrees C., the film deposition pressure is set not lower than 30 Torr. and not higher than 80 Torr., the flow rate of $WF_6$ gas is set not lower than 30 sccm and not higher than 40 sccm, and the flow rate of $SiH_4$ gas is set not lower than 10 sccm and not higher than 30 sccm(nucleation step). Then, a tungsten film is produced by reducing $WF_6$ gas with $H_2$ gas, under the condition in which the substrate temperature is set not lower than 400 degrees C. and not higher than 450 degrees C., the film deposition pressure is set not lower than 80 Torr. and not higher than 100 Torr., the flow rate of $WF_6$ gas is set not lower than 90 sccm and not higher than 100 sccm, and the flow rate of $H_2$ gas is set not lower than 700 sccm and not higher than 1000 sccm (film forming step).

Figure 16:
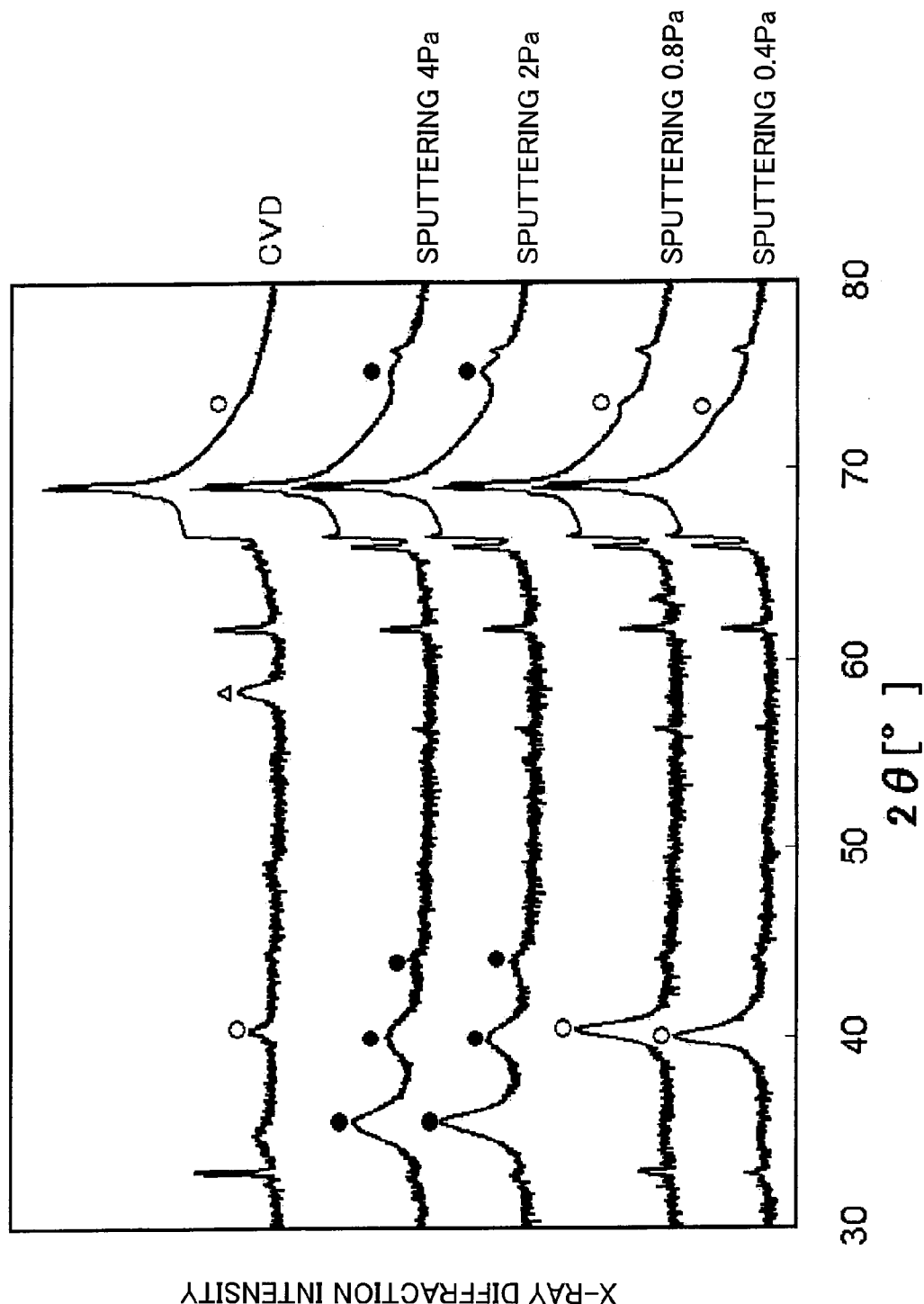
FIG. 16 is X-ray diffraction spectra obtained by comparison between α-tungsten film deposited by a CVD process and a tungsten film deposited by sputtering.
Figure 17:
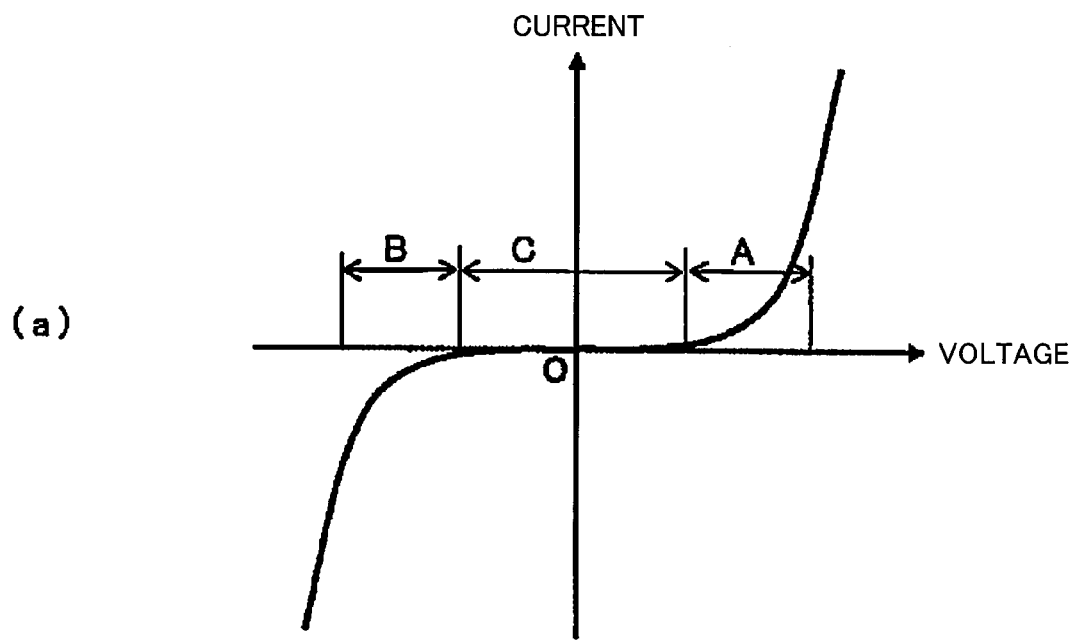
Figure 17:
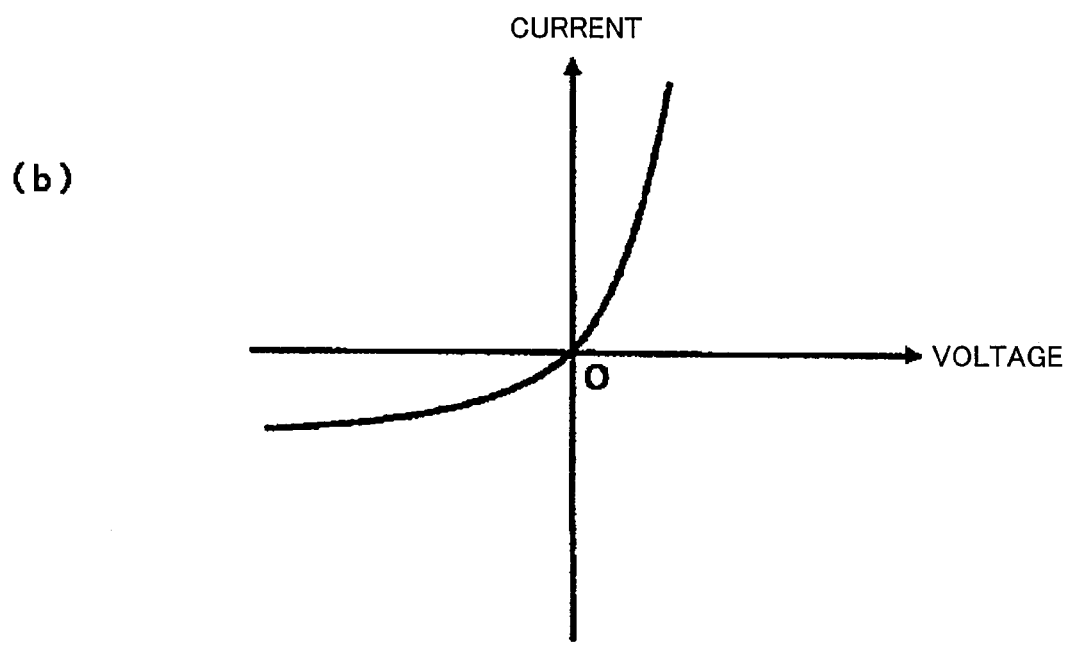

FIG. 16 shows X-ray diffraction spectra comparison between the α-tungsten films deposited by the CVD process and the tungsten films deposited by sputtering.

The experiment conditions are as follows. The nucleus of tungsten was formed by reducing $WF_6$ gas with $SiH_4$ gas under the condition in which the substrate temperature was set to 409 degrees C., the film deposition pressure was set to 30[Torr], the flow rate of $WF_6$ gas was set to 40 sccm, and the flow rate of $SiH_4$ gas was set to 27 sccm. Then, the tungsten film was formed by reducing $WF_6$ gas with $H_2$ gas under the condition in which the substrate temperature was set to 415 degrees C., the film deposition pressure was set to 90 Torr., the flow rate of $WF_6$ gas was set to 95 sccm, and the flow rate of $H_2$ gas was set to 700 sccm.

In FIG. 16, ● symbols indicate peaks of β-tungsten, and ○ and Δ symbols indicate peaks of α-tungsten. ● symbols and ○ symbols are closer to each other in some cases, but are peaks unique to β-tungsten and peaks unique to α-tungsten, respectively.

As can be seen from FIG. 16, in the present example (CVD), there are peaks (two peaks of 40.3 degrees and 73.2 degrees) resulting from α-tungsten (α-W). From this, it is found that α-tungsten is formed in the present example. The peak (58.3 degrees) indicated by Δ is observed only in the present example (CVD), but is not clearly observed in α-tungsten deposited by the sputtering. This may be due to the fact that the tungsten films are different in orientation because of the difference in fabrication method.

In any of the cases where the sputtering process is used, the CVD process is used or other method is used, it could happen that impurities and other matters may be incorporated in the current control layer formed of $SiN_x$, or the electrode formed of α-tungsten. The present invention may encompass the embodiments in which the impurities and other matters enter the current control layer or the electrode, as long as the above mentioned advantages are substantially achieved.

Having described several exemplary embodiments to explain the present invention, these embodiments may be substantially altered without departing a scope and spirit of the present invention.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

Industrial Applicability

A current control element, a fabrication method thereof, a memory element and a fabrication method thereof of the present invention have good industrial applicability as the current control element which is capable of writing data without problem without write disturb, that is, capable of preventing write disturb even when electrical pulses of different polarities are applied, and capable of flowing a large current in a resistance variable element.

EXPLANATION OF REFERENCE NUMERALS 1 resistance variable element
2 current control element
3 memory element
3a memory element (selected element)
4 bit line decoder
5 read circuit
6, 7 word line decoder
11 three-dimensional cross section
20 memory element array
21 memory device
31 second electrode
32 first electrode
33 current control layer 40 lower electrode
41 resistance variable thin layer
42 upper electrode
43 adhesion metal layer
44 conductive via
45 insulating layer
WL0~WL3 word lines
BL0~BL3 bit lines

The invention claimed is:

1. A current control element for controlling a current flowing when a positive or negative electrical pulse is applied, comprising:
   a first electrode;
   a current control layer; and
   a second electrode;
   wherein the current control layer comprises $SiN_x$ ($0<x \leqq 0.85$), and at least one of the first electrode and the second electrode comprises α-tungsten.

2. The current control element according to claim 1, wherein x of $SiN_x$ satisfies $0.3 \leqq x \leqq 0.6$.

3. A method of fabricating a current control element including the steps of forming a first electrode; forming a current control layer comprising $SiN_x$ ($0<x \leqq 0.85$), and forming a second electrode, the current control element being configured to control a current flowing when a positive or negative electrical pulse is applied, the method comprising the steps of:
   forming at least one of the first electrode and the second electrode using α-tungsten, wherein
   the step of forming the current control layer includes a step of sputtering using a target comprising a polycrystalline silicon under a nitrogen-containing atmosphere.

4. The method of fabricating the current control element according to claim 3, wherein the step of forming α-tungsten includes a step of sputtering using a target comprising tungsten, in an argon-containing atmosphere in which a pressure is 0.8 Pa or lower.

5. A memory element comprising:
   a resistance variable element which switches its electrical resistance value in response to a positive or negative electrical pulse applied thereto and retains the switched electrical resistance value; and
   a current control element for controlling a current flowing when the electrical pulse is applied to the resistance variable element;
   wherein the current control element includes a first electrode; a second electrode; and a current control layer sandwiched between the first electrode and the second electrode; and wherein the current control layer comprises $SiN_x$ ($0<x \leqq 0.85$), and at least one of the first electrode and the second electrode comprises α-tungsten.

6. The memory element according to claim 5, wherein x of $SiN_x$ satisfies $0.3 \leqq x \leqq 0.6$.

7. A method of fabricating a memory element comprising the steps of:
   forming a resistance variable element which switches its electrical resistance value in response to a positive or negative electrical pulse applied thereto and retains the switched electrical resistance value; and
   forming a current control element for controlling a current flowing when the electrical pulse is applied to the resistance variable element; wherein
   the step of forming the current control element includes a step of forming a first electrode, a step of forming a current control layer comprising $SiN_x$ ($0<x \leqq 0.85$), and a step of forming a second electrode, the method further comprising:
   forming at least one of the first electrode and the second electrode with α-tungsten; wherein
   the step of forming the current control layer includes a step of sputtering using a target comprising polycrystalline silicon in a nitrogen-containing atmosphere.

8. The method of fabricating the memory element according to claim 7, wherein x of SiNx satisfies $0.3 \leqq x \leqq 0.6$.

9. The method of fabricating the memory element according to claim 7, wherein the step of forming α-tungsten includes a step of sputtering using a target comprising tungsten in an argon-containing atmosphere in which a pressure is 0.8 Pa or lower.

10. The method of fabricating the memory element according to claim 7, wherein the step of forming α-tungsten includes a step of depositing α-tungsten by CVD.

11. A memory device comprising:
    plural memory elements each of which includes:
      a resistance variable element which switches its electrical resistance value in response to a positive or negative electrical pulse applied thereto and retains the switched electrical resistance value; and
      a current control element for controlling a current flowing when the electrical pulse is applied to the resistance variable element;
    wherein the current control element includes a first electrode; a second electrode; and a current control layer sandwiched between the first electrode and the second electrode; and wherein the current control layer comprises $SiN_x$ ($0<x \leqq 0.85$), and at least one of the first electrode and the second electrode comprises α-tungsten; and
    plural bit lines: and
    plural word lines which three-dimensionally cross the plural bit lines, respectively; wherein
    each of the plural memory elements includes a series circuit including the resistance variable element and the current control element; and wherein
    each of the plural memory elements is provided at a section where associated one of the bit lines and associated one of the word lines three-dimensionally cross each other, and in each section, one end of the series circuit is connected to associated one of the bit lines and the other end of the series circuit is connected to associated one of the word lines.

12. The memory device according to claim 11, wherein x of $SiN_x$ satisfies $0.3 \leqq x \leqq 0.6$.

* * * * *